US008101334B2

(12) United States Patent
Ishimi et al.

(10) Patent No.: US 8,101,334 B2
(45) Date of Patent: Jan. 24, 2012

(54) IMAGE PROCESSING METHOD AND IMAGE PROCESSING APPARATUS

(75) Inventors: Tomomi Ishimi, Numazu (JP); Shinya Kawahara, Numazu (JP); Yoshihiko Hotta, Mishima (JP)

(73) Assignee: Ricoh Company, Ltd., Tokyo (JP)

( * ) Notice: Subject to any disclaimer, the term of this patent is extended or adjusted under 35 U.S.C. 154(b) by 358 days.

(21) Appl. No.: 12/369,067

(22) Filed: Feb. 11, 2009

(65) Prior Publication Data

US 2009/0203521 A1 Aug. 13, 2009

(30) Foreign Application Priority Data

Feb. 13, 2008 (JP) ................................ 2008-032155

(51) Int. Cl.
*G03F 7/00* (2006.01)
*G03F 7/20* (2006.01)
*B41J 2/435* (2006.01)

(52) U.S. Cl. ........ 430/270.1; 430/19; 430/945; 347/225

(58) Field of Classification Search ............... 430/270.1, 430/19, 945; 347/224, 225, 236
See application file for complete search history.

(56) References Cited

U.S. PATENT DOCUMENTS

| | | | | |
|---|---|---|---|---|
| 4,811,328 | A * | 3/1989 | Ito et al. | 369/112.28 |
| 5,668,589 | A * | 9/1997 | Kuwabara et al. | 347/253 |
| 6,754,007 | B2 * | 6/2004 | Yamakawa et al. | 359/668 |
| 6,770,592 | B2 | 8/2004 | Suzuki et al. | |
| 6,818,591 | B2 * | 11/2004 | Arai et al. | 503/201 |
| 6,969,695 | B2 | 11/2005 | Kuboyama et al. | |
| 6,989,349 | B2 | 1/2006 | Tatewaki et al. | |
| 7,049,268 | B2 | 5/2006 | Sakata et al. | |
| 7,238,642 | B2 | 7/2007 | Shimbo et al. | |
| 7,338,919 | B2 | 3/2008 | Kawahara et al. | |
| 7,422,996 | B2 | 9/2008 | Shimbo et al. | |
| 7,432,223 | B2 | 10/2008 | Hayakawa et al. | |
| 7,439,993 | B2 | 10/2008 | Ishimi et al. | |
| 2004/0116289 | A1 | 6/2004 | Tsukida et al. | |
| 2007/0036039 | A1 | 2/2007 | Kawahara et al. | |
| 2007/0225161 | A1 | 9/2007 | Yamamoto et al. | |
| 2007/0225162 | A1 | 9/2007 | Kawahara et al. | |

(Continued)

FOREIGN PATENT DOCUMENTS

EP 1752298 A1 2/2007

(Continued)

OTHER PUBLICATIONS

Machine translation of JP 2002-113889A(no date).*

(Continued)

*Primary Examiner* — Amanda C. Walke

(74) *Attorney, Agent, or Firm* — Cooper & Dunham LLP

(57) ABSTRACT

To provide an image processing method including at least one of recording an image onto a thermoreversible recording medium in which transparency or color tone reversibly changes depending upon temperature, by applying a laser beam with the use of a semiconductor laser device so as to heat the thermoreversible recording medium, and erasing an image recorded on the thermoreversible recording medium, by heating the thermoreversible recording medium, wherein an intensity distribution of the laser beam applied in the image recording step satisfies the relationship represented by Expression 1 shown below, $1.20 \leqq I_1/I_2 \leqq 1.29$ Expression 1 where $I_1$ denotes an irradiation intensity of the applied laser beam in a central position of the applied laser beam, and $I_2$ denotes an irradiation intensity of the applied laser beam on a plane corresponding to 95% of the total irradiation energy of the applied laser beam.

10 Claims, 8 Drawing Sheets

U.S. PATENT DOCUMENTS

| | | | |
|---|---|---|---|
| 2008/0151033 | A1 | 6/2008 | Ishimi et al. |
| 2008/0153698 | A1 | 6/2008 | Kawahara et al. |
| 2008/0192618 | A1 | 8/2008 | Nakata et al. |
| 2008/0214391 | A1 | 9/2008 | Kawahara et al. |

FOREIGN PATENT DOCUMENTS

| | | | | |
|---|---|---|---|---|
| JP | 8-267797 | | | 10/1996 |
| JP | 2000-136022 | | | 5/2000 |
| JP | 2002113889 | A | * | 4/2002 |
| JP | 3350836 | | | 9/2002 |
| JP | 2002-347272 | | | 12/2002 |
| JP | 3446316 | | | 7/2003 |
| JP | 2004-1264 | | | 1/2004 |
| JP | 2004-195751 | | | 7/2004 |
| JP | 2004-345273 | | | 12/2004 |
| JP | 3790485 | | | 4/2006 |
| JP | 2007-69605 | | | 3/2007 |
| JP | 3990891 | | | 7/2007 |

OTHER PUBLICATIONS

European search report in connection with a counterpart European patent application No. 09 15 2698.

* cited by examiner

IMAGE PROCESSING METHOD AND IMAGE PROCESSING APPARATUS

BACKGROUND

1. Technical Field

This disclosure relates to an image processing method capable of repeatedly recording and erasing a high-contrast image at high speed by uniformly recording the image at high density and uniformly erasing the image in a short period of time; and an image processing apparatus which can be suitably used in the image processing method.

2. Description of the Related Art

As a method for recording and erasing an image onto and from a thermoreversible recording medium (hereinafter otherwise referred to as "reversible thermosensitive recording medium", "recording medium" or "medium") from a distance or when depressions and protrusions are created on the surface of the thermoreversible recording medium, there has been proposed a method using a noncontact laser (refer to Japanese Patent Application Laid-Open (JP-A) No. 2000-136022). This proposal discloses that noncontact recording is performed utilizing a reversible thermosensitive recording medium as a transport container used in a product distribution line, and that writing is carried out using a laser and erasure is carried out using hot air, warm water, an infrared heater or the like.

Additionally, recording methods each using a laser are disclosed, for example, in Japanese Patent (JP-B) Nos. 3350836 and 3446316 and JP-A Nos. 2002-347272 and 2004-195751.

The technique described in JP-B No. 3350836 is related to a modified image recording and erasing method including placing a photothermal conversion sheet on a thermoreversible recording medium, then irradiating the photothermal conversion sheet with a laser beam, and forming or erasing an image on the thermoreversible recording medium by means of the heat generated. In the specification thereof, it is disclosed that both formation and erasure of an image can be carried out by controlling the irradiation conditions of a laser beam. Specifically, it is disclosed that by controlling at least one of the irradiation time, the irradiation luminosity, the focus and the intensity distribution, it is possible to control the heating temperature in a manner that is divided into a first specific temperature and a second specific temperature of the thermoreversible recording medium, and by changing the cooling rate after heating, it is possible to form and erase an image on the whole surface or partially.

JP-B No. 3446316 describes use of two laser beams and the following methods: a method in which erasure is carried out with one laser beam being used as an elliptical or oval laser beam, and recording is carried out with the other laser beam being used as a circular laser beam; a method in which recording is carried out with the two laser beams being used in combination; and a method in which recording is carried out, with each of the two laser beams being modified and then these modified laser beams being used in combination. According to these methods, use of the two laser beams makes it possible to realize higher density image recording than use of one laser beam does.

Additionally, the technique described in JP-A No. 2002-347272 is related to a method in which at the time of laser recording and erasure, the front and back of one mirror are utilized, and the form of the luminous flux of a laser beam is changed depending upon the optical path difference and the form of the mirror. Thus, the size of an optical spot can be changed and defocusing is made possible with a simple optical system.

Further, JP-A No. 2004-195751 discloses that a residual image after erasure can be removed substantially completely by employing the following conditions: the laser absorption rate of a reversible thermosensitive recording medium in the form of a label is 50% or more; the irradiation energy is 5.0 $mJ/mm^2$ to 15.0 $mJ/mm^2$, and the product of the laser absorption rate and the printing irradiation energy is 3.0 $mJ/mm^2$ to 14.0 $mJ/mm^2$, at the time of printing; and the product of the laser absorption rate and the printing irradiation energy at the time of erasure is 1.1 times to 3.0 times the above-mentioned product.

Meanwhile, as an image erasing method using a laser, JP-A No. 2003-246144, for example, proposes a method in which an image with clear contrast can be recorded onto a highly durable reversible thermosensitive recording medium by erasing the image such that the energy of a laser beam, the irradiation time of the laser beam and the pulse width scanning speed at the time of erasure are 25% to 65% of those at the time of laser recording.

According to the above-mentioned methods, images can be recorded and erased by the lasers; however, since laser control is not taken at the time of recording, there is a problem that local thermal damage arises at places where lines overlap at the time of recording, and there is a problem that the color-developing density decreases when solid images are recorded.

With the intention of solving these problems, methods of controlling printing energy are disclosed in JP-A Nos. 2003-127446 and 2004-345273.

JP-A No. 2003-127446 describes the following: laser irradiation energy is controlled for every written point, and when printing is performed such that recording dots overlap or printing is performed onto a folded material, the amount of energy applied thereto is reduced; also, when linear printing is performed, the amount of energy is reduced at predetermined intervals so as to lessen local thermal damage and thereby to prevent degradation of a reversible thermosensitive recording medium.

Meanwhile, in JP-A No. 2004-345273, an attempt is made to reduce energy at the time of laser writing, by multiplying the irradiation energy by the expression $|\cos 0.5R|^k$ ($0.3<k<4$), where R denotes the angle of a varied-angle point. This makes it possible at the time of laser recording to prevent excessive energy from being applied to a part where linear images overlap and thereby to reduce degradation of a medium, or to maintain contrast without reducing energy too much.

Additionally, as a method for preventing decrease in color-developing density, JP-A Nos. 2004-1264 proposes a method in which in order to prevent a previously recorded image from being erased when additional writing is carried out using a laser, the dot arrangement pitch for sub scanning is made two or more times greater than the color-developing radius of a laser beam and less than or equal to the sum of the color-erasing radius and the color-developing radius of the laser beam, thereby preventing decrease in color-developing density and creation of a trace of erasure.

As just described, in the above-mentioned methods, attempts are made to avoid application of excessive thermal energy to thermoreversible recording media, caused by overlapping at the time of laser recording. Also, since the intensity distribution of a laser beam is generally in the form of a Gaussian distribution in which the central part of the laser beam is great in intensity, written lines can be changed in width by adjusting the irradiation power, without needing to change the irradiation distance. However, since the energy of the central part becomes extremely high, excessive energy is applied to a thermoreversible recording medium, and when recording and erasure are repeatedly carried out, the thermoreversible recording medium degrades at portions corresponding to the central part.

As a result of carrying out a series of earnest examinations so as to solve the above-mentioned problems, the present inventors have previously proposed an image processing method and an image processing apparatus, wherein in the intensity distribution of a laser beam in a cross section substantially perpendicular to the proceeding direction of the laser beam, the irradiation intensity of the central part needs to be approximately equal to or less than that of the surrounding part, with the phrase “approximately equal to or less than” denoting 1.05 or less times, and the irradiation intensity of the central part is preferably 1.03 or less times that of the surrounding part, and more preferably 1.0 or less time; ideally, the irradiation intensity of the central part is lower than, namely less than 1.0 time, that of the surrounding part (JP-A No. 2007-69605). Here, for the definitions of the central part and the surrounding part, the paragraph [0021] in JP-A No. 2007-69605 states that “in the intensity distribution of the laser beam in the cross section substantially perpendicular to the proceeding direction of the laser beam, the ‘central part’ denotes a site corresponding to an area sandwiched between the apical portions of two maximum peaks in the shape of inverted convexities, included in a differential curve formed when a curve representing the intensity distribution is differentiated twice; and the ‘surrounding part’ denotes a site corresponding to an area other than the ‘central part’”.

In JP-A No. 2007-69605, since the intensity distribution is provided in which the irradiation intensity of the central part of the laser beam is approximately equal to or less than that of the surrounding part, uniform energy can be applied to a thermoreversible recording medium, and thus the thermoreversible recording medium does not degrade much even when recording and erasure are repeatedly carried out. However, in such an intensity distribution written lines can hardly be changed in width on a thermoreversible recording medium by changing the irradiation power. In order to change the written lines in width, the spot diameter of the laser beam should be changed by changing the irradiation distance. Thus, it is necessary to move a laser device or the thermoreversible recording medium.

Moreover, due to variation in irradiation power; as to a laser beam exhibiting an intensity distribution in the form of a Gaussian distribution in which the central part of the laser beam is high in irradiation intensity, recording is not hindered even when the irradiation power is slightly reduced, because the irradiation intensity of the central part is high enough, whereas as to a laser beam exhibiting an intensity distribution in which the irradiation intensity of the central part of the laser beam is approximately equal to or less than that of the surrounding part, there is a problem that recording may not take place when the irradiation power is reduced.

Thus, as things stand at present, provision of an image processing method and an image processing apparatus is hoped for, wherein a thermoreversible recording medium can be uniformly heated, excessive energy is not applied to the thermoreversible recording medium, degradation of the thermoreversible recording medium can be reduced when recording and erasure are repeatedly carried out, durability against repeated use can be improved, and written lines can be changed in width by adjusting the irradiation power, without needing to change the irradiation distance.

BRIEF SUMMARY

In an aspect of this disclosure, there is provided an image processing method and an image processing apparatus, wherein a thermoreversible recording medium can be uniformly heated, excessive energy is not applied to the thermoreversible recording medium, degradation of the thermoreversible recording medium can be reduced when recording and erasure are repeatedly carried out, durability against repeated use can be improved, and written lines can be changed in width by adjusting the irradiation power, without needing to change the irradiation distance.

Means for solving the above-mentioned problems are as follows.

<1> An image processing method including at least one of recording an image onto a thermoreversible recording medium in which transparency or color tone reversibly changes depending upon temperature, by applying a laser beam with the use of a semiconductor laser device so as to heat the thermoreversible recording medium, and erasing an image recorded on the thermoreversible recording medium, by heating the thermoreversible recording medium, wherein an intensity distribution of the laser beam applied in the image recording step satisfies the relationship represented by Expression 1 shown below, $$1.20 \leqq I_1/I_2 \leqq 1.29 \quad \text{Expression 1}$$

where $I_1$ denotes an irradiation intensity of the applied laser beam in a central position of the applied laser beam, and $I_2$ denotes an irradiation intensity of the applied laser beam on a plane corresponding to 95% of the total irradiation energy of the applied laser beam.

<2> The image processing method according to <1>, wherein the step of erasing an image is carried out by applying a laser beam so as to heat the thermoreversible recording medium.

<3> The image processing method according to any one of <1> to <2>, wherein the thermoreversible recording medium contains at least a support, and a thermoreversible recording layer over the support; and the transparency or color tone of the thermoreversible recording layer reversibly changes at a first specific temperature and at a second specific temperature higher than the first specific temperature.

<4> The image processing method according to <3>, wherein the thermoreversible recording layer contains a resin and a low-molecular organic material.

<5> The image processing method according to <3>, wherein the thermoreversible recording layer contains a leuco dye and a reversible developer.

<6> The image processing method according to any one of <1> to <5>, wherein the thermoreversible recording medium contains a photothermal conversion material.

<7> The image processing method according to <6>, wherein the thermoreversible recording layer contains the photothermal conversion material.

<8> The image processing method according to any one of <6> to <7>, wherein the photothermal conversion material is a phthalocyanine compound.

<9> The image processing method according to any one of <1> to <8>, being used for at least one of recording an image onto a moving object and erasing an image from the moving object.

<10> An image processing apparatus includes a laser beam emitting unit that is a semiconductor laser device, a beam scanning unit disposed on a surface from which a laser beam is emitted in the laser beam emitting unit, a beam condensing unit configured to condense a laser beam and an irradiation intensity distribution adjusting unit configured to change an irradiation intensity distribution of a laser beam, wherein the image processing apparatus is used in the image processing method according to any one of <1> to <9>.

<11> The image processing apparatus according to <10>, wherein the irradiation intensity distribution adjusting unit is at least any one of a lens, a filter, a mask, a fiber coupling and a mirror.

<12> The image processing apparatus according to <11>, wherein the lens is at least one of an aspheric element lens and a diffractive optical element.

<13> The image processing apparatus according to any one of <10> and <12>, wherein the laser beam emitting unit is a semiconductor laser diode and the image processing apparatus further contains a cooling unit configured to cool the semiconductor laser diode while measuring and controlling the temperature of the semiconductor laser diode.

<14> The image processing apparatus according to any one of <10> to <13>, wherein the laser beam emitting unit is a semiconductor laser diode, which has emission wavelengths of 0.70 μm to 1.55 μm.

<15> The image processing apparatus according to any one of <10> to <14>, wherein the beam scanning unit is a galvano mirror, and the beam condensing unit is an fθ lens.

The aforementioned image processing method includes at least one of recording an image onto a thermoreversible recording medium in which transparency or color tone reversibly changes depending upon temperature, by applying a laser beam with the use of a semiconductor laser device so as to heat the thermoreversible recording medium, and erasing an image recorded on the thermoreversible recording medium, by heating the thermoreversible recording medium, wherein an intensity distribution of the laser beam applied in the image recording step satisfies the relationship represented by Expression 1 shown below, $$1.20 \leqq I_1/I_2 \leqq 1.29 \quad \text{Expression 1}$$

where $I_1$ denotes an irradiation intensity of the applied laser beam in a central position of the applied laser beam, and $I_2$ denotes an irradiation intensity of the applied laser beam on a plane corresponding to 95% of the total irradiation energy of the applied laser beam.

In the aforementioned image processing method, the intensity distribution of the laser beam applied in the image recording step satisfies the relationship represented by the expression $1.20 \leqq I_1/I_2 \leqq 1.29$ (where $I_1$ denotes the irradiation intensity of the applied laser beam in a central position of the applied laser beam, and $I_2$ denotes the irradiation intensity of the applied laser beam on a plane corresponding to 95% of the total irradiation energy of the applied laser beam); thus, excessive energy is not applied to a thermoreversible recording medium, degradation of the thermoreversible recording medium can be reduced when recording and erasure are repeatedly carried out, durability against repeated use can be improved, and written lines can be changed in width by adjusting the irradiation power, without needing to change the irradiation distance.

The aforementioned image processing apparatus is used in the image processing method and contains at least a laser beam emitting unit, a beam scanning unit, a beam condensing unit and an irradiation intensity distribution adjusting unit.

In the image processing apparatus, a semiconductor laser device serving as the laser beam emitting unit emits a laser beam. The irradiation intensity distribution adjusting unit changes the intensity of a laser beam emitted from the laser beam emitting unit, such that the ratio ($I_1/I_2$) satisfies $1.20 \leqq I_1/I_2 \leqq 1.29$ (where $I_1$ denotes the irradiation intensity of the applied laser beam in a central position of the applied laser beam, and $I_2$ denotes the irradiation intensity of the applied laser beam on a plane corresponding to 95% of the total irradiation energy of the applied laser beam). Consequently, excessive energy is not applied to a thermoreversible recording medium, degradation of the thermoreversible recording medium can be reduced when recording and erasure are repeatedly carried out, durability against repeated use can be improved, and written lines can be changed in width by adjusting the irradiation power, without needing to change the irradiation distance.

Figure 1:
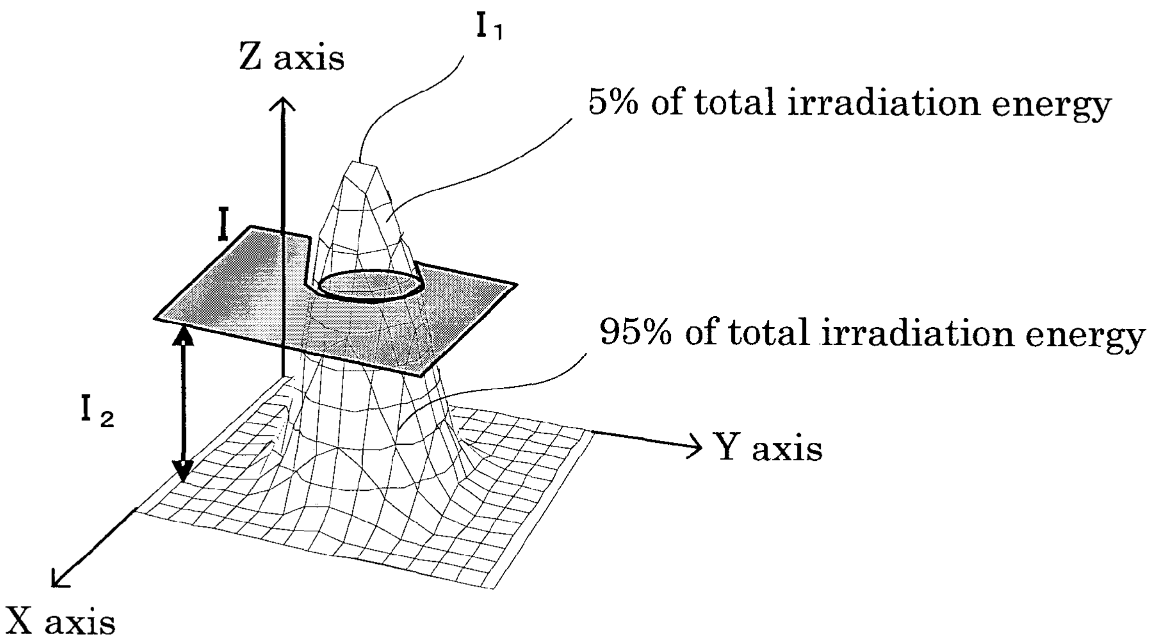
FIG. 1 is a schematic explanatory diagram showing an example of the intensity distribution of an applied laser beam used in the present invention.

DETAILED DESCRIPTION OF THE INVENTION (Image Processing Method)

An image processing method of the present invention includes at least one of an image recording step and an image erasing step, and further includes other steps suitably selected in accordance with the necessity.

The image processing method of the present invention includes all of the following aspects: an aspect in which both recording and erasure of an image are performed, an aspect in which only recording of an image is performed, and an aspect in which only erasure of an image is performed.

<Image Recording Step and Image Erasing Step>

The image recording step in the image processing method of the present invention is a step of recording an image onto a thermoreversible recording medium in which transparency or color tone reversibly changes depending upon temperature, by applying a laser beam with the use of a semiconductor laser device so as to heat the thermoreversible recording medium.

The image erasing step in the image processing method of the present invention is a step of erasing an image recorded on the thermoreversible recording medium, by heating the thermoreversible recording medium.

For a heat source used at the time of heating, a laser beam or other heat sources may be used. As to such heat sources, in the case where the thermoreversible recording medium is heated by laser beam irradiation, it takes a long time to irradiate the whole of a predetermined area by scanning with one laser beam; accordingly, to erase an image in a short time, it is desirable to erase it by heating the thermoreversible recording medium with the use of an infrared lamp, a heat roller, a hot stamp, a dryer or the like. Also, in the case where the thermoreversible recording medium is mounted on a Styrofoam box serving as a transport container used in a product distribution line, if the Styrofoam box itself is heated, it will melt, and thus it is desirable to erase an image by applying a laser beam so as to heat only the thermoreversible recording medium locally.

By applying the laser beam so as to heat the thermoreversible recording medium, it is possible to record and erase an image onto the thermoreversible recording medium in a non-contact manner.

In the image processing method of the present invention, normally, an image is renewed for a first time when the thermoreversible recording medium is reused (the above-mentioned image erasing step), then an image is recorded by the image recording step; however, recording and erasure of an image do not necessarily have to follow this order, and an image may be recorded by the image recording step first and then erased by the image erasing step.

In the present invention, an intensity distribution of the laser beam applied in the image recording step satisfies the relationship represented by Expression 1 shown below.

$$1.20 \leqq I_1/I_2 \leqq 1.29 \quad \text{Expression 1}$$

where $I_1$ denotes an irradiation intensity of the applied laser beam in a central position of the applied laser beam, and $I_2$ denotes an irradiation intensity of the applied laser beam on a plane corresponding to 95% of the total irradiation energy of the applied laser beam.

When the intensity distribution of an applied laser beam is divided by a horizontal plane with regard to a travelling direction in an orthogonal direction, such that the maximum value of the intensity is included in the region occupying 5% of the total irradiation energy, the irradiation intensity of the applied laser beam on the horizontal plane is defined as $I_2$, an irradiation intensity of the applied laser beam in a central position of the applied laser beam is defined as $I_1$, and the ratio ($I_1/I_2$) is 1.43 given by Gaussian distribution (normal distribution).

Here, as shown in FIG. 1, the "plane corresponding to 95% of the total irradiation energy of the applied laser beam" means a horizontal dividing plane, in the case where the irradiation intensity of the laser beam is measured using a high-power beam analyzer with a high-sensitivity pyroelectric camera, the obtained irradiation intensity is formed into a three-dimensional graph, and the irradiation intensity distribution is divided into two regions such that the region sandwiched between the plane where z=0 and the dividing plane which is horizontal to the plane where z=0 occupies 95% of the total irradiation energy. On this occasion, the Z axis denotes the irradiation intensity of the applied laser beam.

The total irradiation energy means the total energy of a laser beam applied onto a thermoreversible recording medium.

The central position of the applied laser beam is a position which can be calculated by dividing the summation of the product of the irradiation intensity in each position and the coordinates at each position by the summation of the irradiation intensity in each position. The position can be represented by the following expression.

$$\Sigma(ri \times Ii)/\Sigma Ii$$

Note that "ri" denotes the coordinates at each position, "Ii" denotes the irradiation intensity in each position, and "ΣIi" denotes the total irradiation intensity.

Figure 2A:
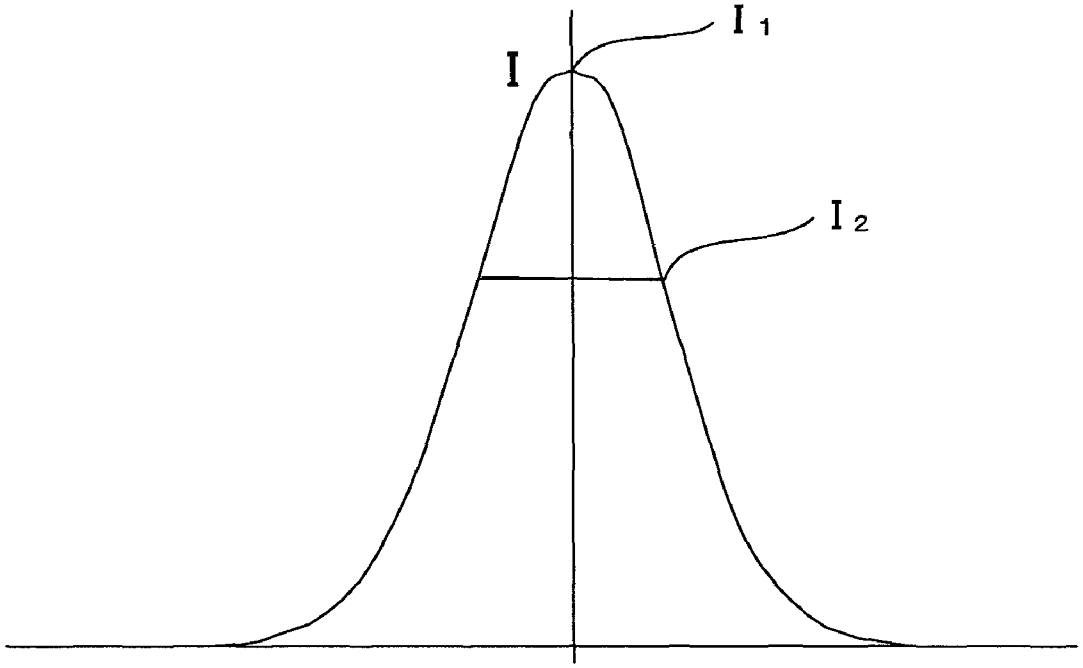
FIG. 2A is a schematic explanatory diagram showing the intensity distribution (Gaussian distribution) of a laser beam in its normal state.
Figure 2B:
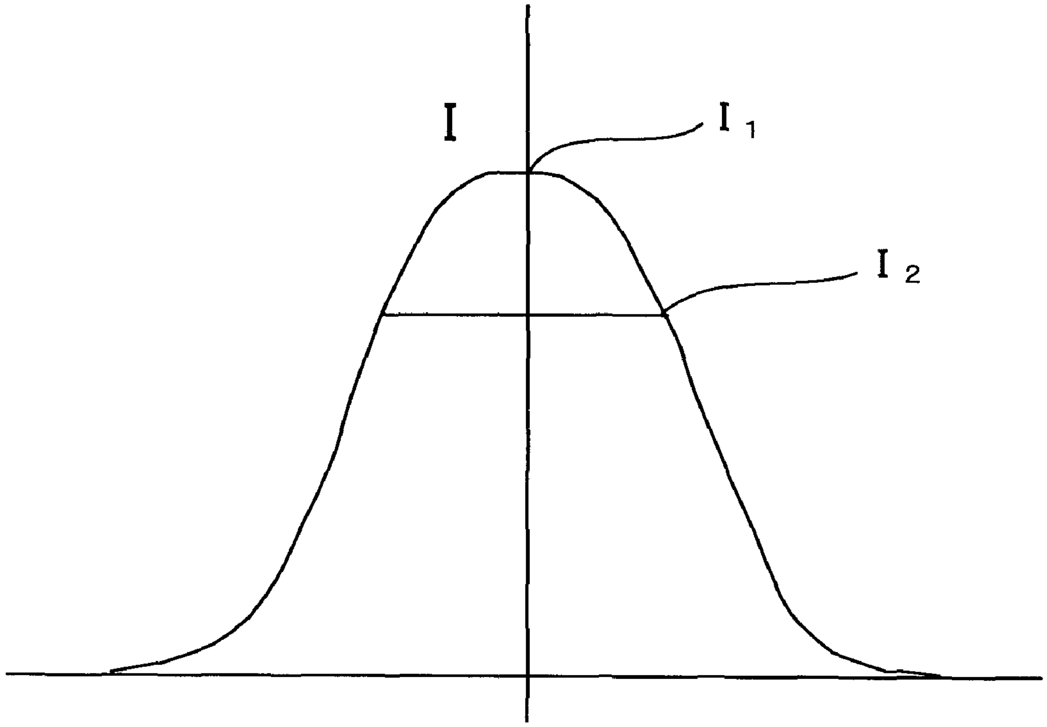
FIG. 2B is a schematic explanatory diagram showing an example of the intensity distribution of the laser beam when the intensity distribution has been changed.
Figure 2C:
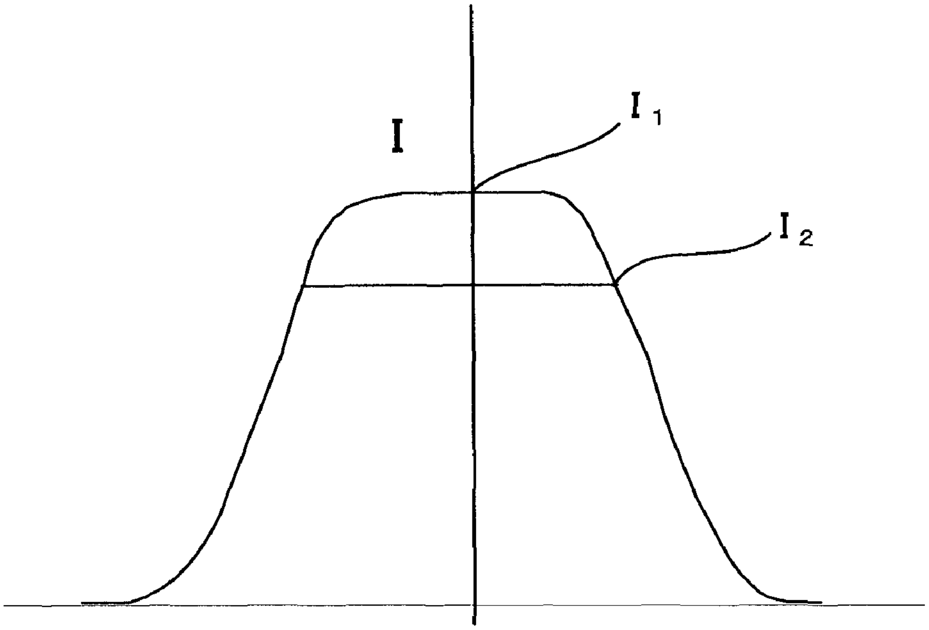
FIG. 2C is a schematic explanatory diagram showing another example of the intensity distribution of the laser beam when the intensity distribution has been changed.
Figure 2D:
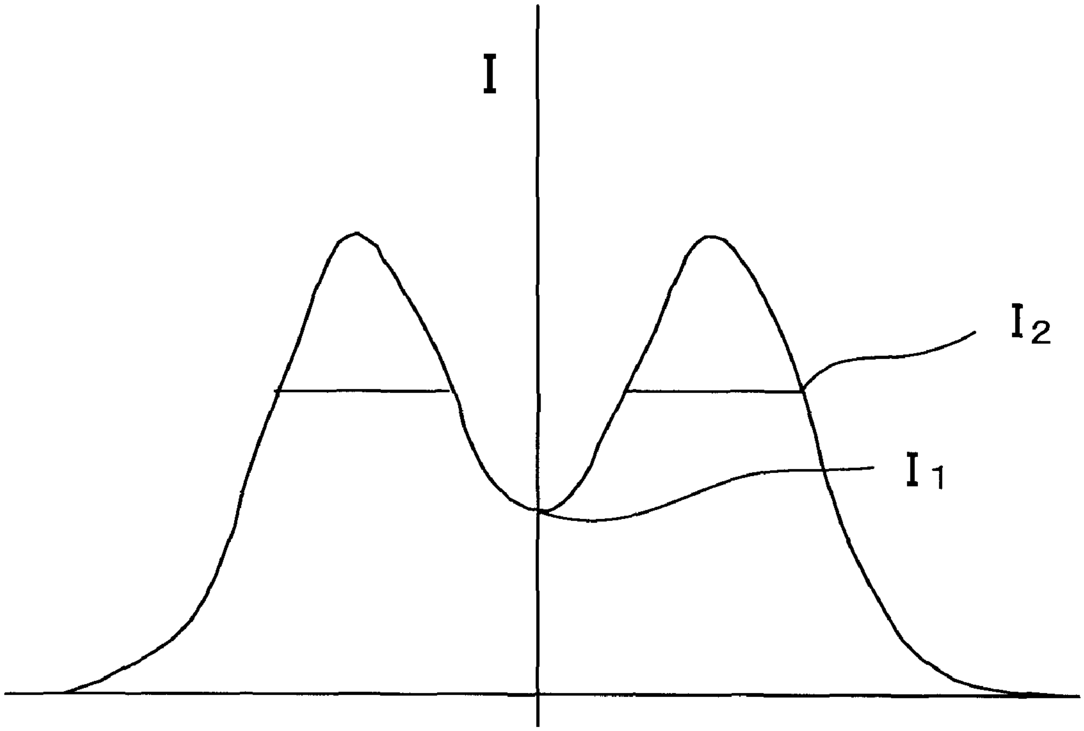
FIG. 2D is a schematic explanatory diagram showing yet another example of the intensity distribution of the laser beam when the intensity distribution has been changed.

FIGS. 2A to 2D each show an example of an intensity distribution curve of an applied laser beam in a cross section including the maximum value, when the intensity distribution has been changed. FIG. 2A shows a Gaussian distribution; in such an intensity distribution in which the central part of the laser beam is high in irradiation intensity, $I_2$ is low with respect to $I_1$, and thus the ratio ($I_1/I_2$) is large. Meanwhile, as shown in FIG. 2B, in an intensity distribution in which the central part of the laser beam is lower in irradiation intensity than that in the intensity distribution of FIG. 2A, $I_2$ is large with respect to $I_1$, and thus the ratio ($I_1/I_2$) is lower than that in the intensity distribution of FIG. 2A. In an intensity distribution having a form similar to that of a top hat, as shown in FIG. 2C, $I_2$ further increases with respect to $I_1$, and thus the ratio ($I_1/I_2$) is even lower than that in the intensity distribution of FIG. 2B. In an intensity distribution in which the central part of the laser beam is low in irradiation intensity and the surrounding part is high in irradiation intensity, as shown in FIG. 2D, $I_1$ decreases with respect to $I_2$, and thus the ratio ($I_1/I_2$) is even lower than that in the intensity distribution of FIG. 2C. Hence, the ratio ($I_1/I_2$) indicates the form of the irradiation intensity distribution of the laser beam.

In the present invention, when the ratio ($I_1/I_2$) is less than or equal to 1.20, there is an intensity distribution in the form of a top hat or in which the irradiation intensity of the central part is lower than that of the surrounding part; thus, degradation of a thermoreversible recording medium caused by repeated use can be reduced, and erasure of an image is possible even when recording and erasure are repeatedly carried out; however, written lines cannot be changed in width unless the irradiation distance is changed, and if the ratio ($I_1/I_2$) further decreases, the irradiation intensity of the central part is so low that when an image is recorded, a line may split in two without developing the color of its central part.

When the ratio ($I_1/I_2$) is greater than 1.29, written lines can be changed in width by adjusting the irradiation power, without needing to change the irradiation distance; however, excessive energy is applied to a thermoreversible recording medium, and when recording and erasure are repeatedly carried out, there may be an unerased portion left owing to degradation of the thermoreversible recording medium.

The ratio ($I_1/I_2$) preferably satisfies $1.20 \leqq I_1/I_2 \leqq 1.29$, and more preferably satisfies $1.20 \leqq I_1/I_2 \leqq 1.25$.

In the present invention, a semiconductor laser is used as the laser beam emitting unit, and a laser beam therefrom is adsorbed in a photothermal conversion layer or a recording layer in which a photothermal conversion material is added, and thermal diffusion enables to easily make the temperature distribution in the recording layer uniform.

In the present invention, it is important in the irradiation intensity distribution of the laser beam that the ratio ($I_1/I_2$) be within a specific range, where "$I_1$" denotes the irradiation intensity of the laser beam in a central position of the laser beam, and "$I_2$" denotes the minimum value in a region which includes a peak of the energy distribution and a certain percentage of the total irradiation energy of the applied laser beam.

The method of making the ratio ($I_1/I_2$) satisfy $1.20 \leqq I_1/I_2 \leqq 1.29$, is not particularly limited and may be suitably selected in accordance with the intended use; for instance, an irradiation intensity distribution adjusting unit can be suitably used. The irradiation intensity distribution adjusting unit will be described later.

The spot diameter of the laser beam applied in the image recording step is preferably 0.05 mm to 5.0 mm.

The method for changing the intensity distribution of the laser beam so as to satisfy the ratio ($I_1/I_2$) represented by the expression: $1.20 \leqq I_1/I_2 \leqq 1.29$, is not particularly limited and may be suitably selected in accordance with the intended use; for instance, an irradiation intensity distribution adjusting unit can be suitably used.

The irradiation intensity distribution adjusting unit is not particularly limited and may be suitably selected in accordance with the intended use. Suitable examples thereof include lenses, filters, masks, mirrors and fiber couplings. Among these, lenses are preferable because of causing less energy loss. Examples of lenses include kaleidoscopes, integrators, aspheric element lenses, beam homogenizers, aspheric beam shapers (each of which is a combination of an intensity transformation lens and a phase correction lens), and diffractive optical elements. Among these, aspheric element lenses and diffractive optical elements are particularly preferable.

When a filter, a mask or the like is used, the irradiation intensity can be adjusted by physically cutting a central part of the laser beam. Meanwhile, when a mirror is used, the irradiation intensity can be adjusted by using, for example, a deformable mirror that is linked to a computer and can be mechanically changed in shape, or a mirror in which the reflectance or the formation of depressions and protrusions on the surface varies from part to part. A semiconductor laser having emission wavelengths of visible light to near infrared light is preferably used, because the irradiation intensity of an applied laser beam is easily adjusted by fiber coupling.

The output of the laser beam applied in the image recording step is not particularly limited and may be suitably selected in accordance with the intended use; however, it is preferably 1 W or greater, more preferably 3 W or greater, and even more preferably 3 W or greater. When the output of the laser beam is less than 1 W, it takes a long time to record an image, and if an attempt is made to reduce the time spent on image recording, a high-density image cannot be obtained because of a lack of output. Additionally, the upper limit of the output of the laser beam is not particularly limited and may be suitably selected in accordance with the intended use; however, it is preferably 200 W or less, more preferably 150 W or less, and even more preferably 100 W or less. When the output of the laser beam is greater than 200 W, it leads to an increase in the size of a laser device.

The scanning speed of the laser beam applied in the image recording step is not particularly limited and may be suitably selected in accordance with the intended use; however, it is preferably 300 mm/s or greater, more preferably 500 mm/s or greater, and even more preferably 700 mm/s or greater. When the scanning speed is less than 300 mm/s, it takes a long time to record an image. Additionally, the upper limit of the scanning speed of the laser beam is not particularly limited and may be suitably selected in accordance with the intended use; however, it is preferably 15,000 mm/s or less, more preferably 10,000 mm/s or less, and even more preferably 8,000 mm/s or less. When the scanning speed is higher than 15,000 mm/s, it is difficult to record a uniform image.

The spot diameter of the laser beam applied in the image recording step is not particularly limited and may be suitably selected in accordance with the intended use; however, it is preferably 0.02 mm or greater, more preferably 0.1 mm or greater, and even more preferably 0.15 mm or greater.

Additionally, the upper limit of the spot diameter of the laser beam is not particularly limited and may be suitably selected in accordance with the intended use; however, it is preferably 3.0 mm or less, more preferably 2.5 mm or less, and even more preferably 2.0 mm or less.

When the spot diameter is small, the line width of an image is also thin, and the contrast of the image lowers, thereby causing a decrease in visibility. When the spot diameter is large, the line width of an image is also thick, and adjacent lines overlap, thereby making it impossible to print small letters/characters.

The output of a laser beam applied in the image erasing step where a recorded image is erased by applying a laser beam so as to heat the thermoreversible recording medium is not particularly limited and may be suitably selected in accordance with the intended use; however, it is preferably 5 W or greater, more preferably 7 W or greater, and even more preferably 10 W or greater. When the output of the leaser beam is less than 5 W, it takes some time to erase a recorded image, and if an attempt is made to reduce the time spent on image erasing, an image erasing defect occurs because of a lack of the output. Additionally, the upper limit of the output of the laser beam is not particularly limited and may be suitably selected in accordance with the intended use; however, it is preferably 200 W or less, more preferably 150 W or less, and even more preferably 100 W or less. When the output of the laser beam is more than 200 W, it leads to an increase in the size of a laser device.

The scanning speed of a laser beam applied in the image erasing step where a recorded image is erased by applying a laser beam so as to heat the thermoreversible recording medium is not particularly limited and may be suitably selected in accordance with the intended use; however, it is preferably 100 mm/s or greater, more preferably 200 mm/s or greater, and even more preferably 300 mm/s or greater. When the scanning speed is less than 100 mm/s, it takes some time to erase a recorded image. Additionally, the upper limit of the scanning speed of the laser beam is not particularly limited and may be suitably selected in accordance with the intended use; however, it is preferably 20,000 mm/s or less, more preferably 15,000 mm/s or less, and even more preferably 10,000 mm/s or less. When the scanning speed is higher than 20,000 mm/s, it is difficult to uniformly erase a recorded image.

The spot diameter of a laser beam applied in the image erasing step where a recorded image is erased by applying a laser beam so as to heat the thermoreversible recording medium is not particularly limited and may be suitably selected in accordance with the intended use; however, it is preferably 0.5 mm or greater, more preferably 1.0 mm or greater, and even more preferably 2.0 mm or greater.

Additionally, the upper limit of the spot diameter of the laser beam is not particularly limited and may be suitably selected in accordance with the intended use; however, it is preferably 14.0 mm or less, more preferably 10.0 mm or less, and still more preferably 7.0 mm or less.

When the spot diameter is small, it takes some time to erase a recorded image. When the spot diameter is large, an image erasing defect may occur because of a lack of the output.

As a laser that emits the laser beam, a semiconductor laser is used.

The method for measuring the intensity distribution of the laser beam is not particularly limited and may be suitably selected as long as the intensity distribution of a semiconductor laser beam can be measured; however, use of a device capable of measuring it with a resolution of 10 μm or less is preferable because the accuracy of the intensity distribution measurement can be enhanced.

<Image Recording and Image Erasing Mechanism>

The image recording and image erasing mechanism includes an aspect in which transparency reversibly changes depending upon temperature, and an aspect in which color tone reversibly changes depending upon temperature.

In the aspect in which transparency reversibly changes depending upon temperature, the low-molecular organic material in the thermoreversible recording medium is dispersed in the form of particles in the resin, and the transparency reversibly changes by heat between a transparent state and a white turbid state.

The change in the transparency is viewed based upon the following phenomena. In the case of the transparent state (1), particles of the low-molecular organic material dispersed in a resin base material and the resin base material are closely attached to each other without spaces, and there is no void inside the particles; therefore, a beam that has entered from one side permeates to the other side without diffusing, and thus the thermoreversible recording medium appears transparent. Meanwhile, in the case of the white turbid state (2), the particles of the low-molecular organic material are formed by fine crystals of the low-molecular organic material, and there are spaces (voids) created at the interfaces between the crystals or the interfaces between the particles and the resin base material; therefore, a beam that has entered from one side is refracted at the interfaces between the voids and the crystals or the interfaces between the voids and the resin and thereby diffuses, and thus the thermoreversible recording medium appears white.

Figure 4A:
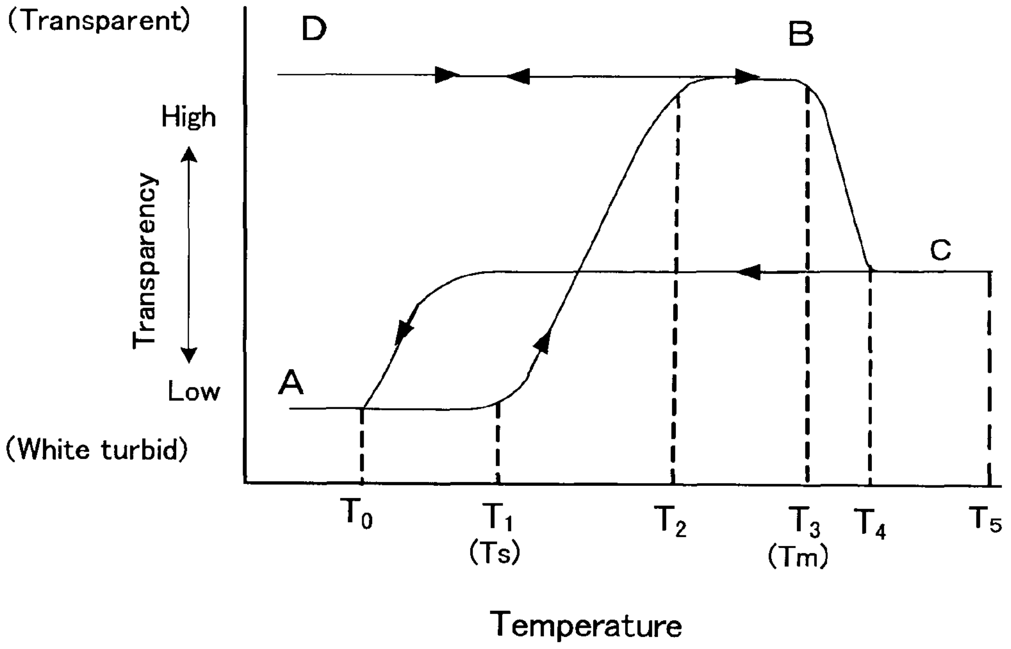
FIG. 4A is a graph showing the transparency—white turbidity properties of a thermoreversible recording medium.

First of all, an example of the temperature-transparency change curve of a thermoreversible recording medium having a thermoreversible recording layer (hereinafter otherwise referred to as "recording layer") formed by dispersing the low-molecular organic material in the resin is shown in FIG. 4A.

The recording layer is in a white turbid opaque state (A), for example, at normal temperature that is lower than or equal to the temperature $T_0$. Once the recording layer is heated, it gradually becomes transparent as the temperature exceeds the temperature $T_1$. When heated to a temperature between the temperatures $T_2$ and $T_3$, the recording layer becomes transparent (B). The recording layer remains transparent (D) even if the temperature is brought back to normal temperature that is lower than or equal to $T_0$. This is attributed to the following phenomena: when the temperature is in the vicinity of $T_1$, the resin starts to soften, then as the softening proceeds, the resin contracts, and voids at the interfaces between the resin and particles of the low-molecular organic material or voids inside these particles are reduced, so that the transparency gradually increases; at temperatures between $T_2$ and $T_3$, the low-molecular organic material comes into a semi-melted state, and the recording layer becomes transparent as remaining voids are filled with the low-molecular organic material; when the recording layer is cooled with seed crystals remaining, crystallization takes place at a fairly high temperature; at this time, since the resin is still in the softening state, the resin adapts to a volume change of the particles caused by the crystallization, the voids are not created, and the transparent state is maintained.

When further heated to a temperature higher than or equal to the temperature $T_4$, the recording layer comes into a semi-transparent state (C) that is between the maximum transparency and the maximum opacity. Next, when the temperature is lowered, the recording layer returns to the white turbid opaque state (A) it was in at the beginning, without coming into the transparent state again. It is inferred that this is because the low-molecular organic material completely melts at a temperature higher than or equal to T4, then comes into a supercooled state and crystallizes at a temperature a little higher than $T_0$, and on this occasion, the resin cannot adapt to a volume change of the particles caused by the crystallization, which leads to creation of voids.

Here, in FIG. 4A, when the temperature of the recording layer is repeatedly raised to the temperature $T_5$ far higher than $T_4$, there may be caused such an erasure failure that an image cannot be erased even if the recording layer is heated to an erasing temperature. This is attributed to a change in the internal structure of the recording layer caused by transfer of the low-molecular organic material, which has been melted by heating, in the resin. To reduce degradation of the thermoreversible recording medium caused by repeated use, it is necessary to decrease the difference between $T_4$ and $T_5$ in FIG. 4A when the thermoreversible recording medium is heated; in the case where a means of heating it is a laser beam, the ratio $(I_1/I_2)$ in the intensity distribution of the laser beam is preferably 1.29 or less, and more preferably 1.25 or less.

As to the temperature-transparency change curve shown in FIG. 4A, it should be noted that when the type of the resin, the low-molecular organic material, etc. is changed, the transparency in the above-mentioned states may change depending upon the type.

Figure 4B:
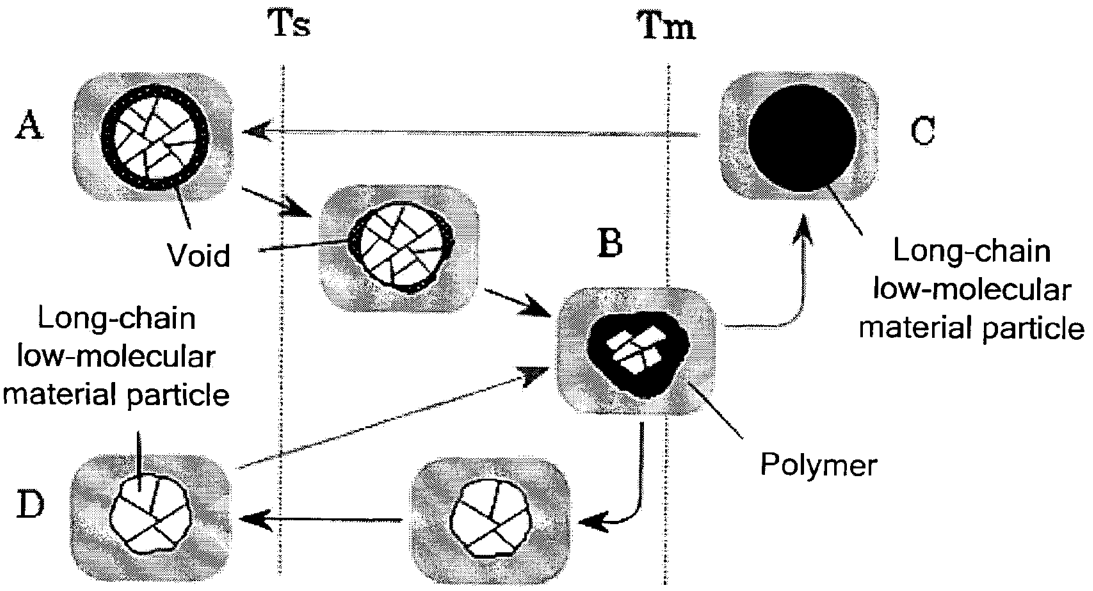
FIG. 4B is a schematic explanatory diagram showing the mechanism of a transparency—white turbidity change of a thermoreversible recording medium.

FIG. 4B shows the mechanism of change in the transparency of the thermoreversible recording medium in which the transparent state and the white turbid state reversibly change by heat.

In FIG. 4B, one long-chain low-molecular material particle and a polymer around it are viewed, and changes related to creation and disappearance of a void, caused by heating and cooling, are shown. In a white turbid state (A), a void is created between the polymer and the low-molecular material particle (or inside the particle), and thus there is a state of light diffusion. When these are heated to a temperature higher than the softening temperature (Ts) of the polymer, the void decreases in size, and the transparency thereby increases. When these are further heated to a temperature close to the melting temperature (Tm) of the low-molecular material particle, a part of the low-molecular material particle melts; due to volume expansion of the low-molecular material particle that has melted, the void disappears as it is filled with the low-molecular material particle, and a transparent state (B) is thus produced. When cooling is carried out from this temperature, the low-molecular material particle crystallizes immediately below the melting temperature, a void is not created, and a transparent state (D) is maintained even at room temperature.

Subsequently, when heating is carried out such that the temperature becomes higher than or equal to the melting temperature of the low-molecular material particle, there is created a difference in refractive index between the low-molecular material particle that has melted and the polymer around it, and a semitransparent state (C) is thus produced. When cooling is carried out from this temperature to room temperature, the low-molecular material particle is supercooled and crystallizes at a temperature lower than or equal to the softening temperature of the polymer; at this time, the polymer around the low-molecular material particle is in a glassy state and therefore cannot adapt to a volume reduction of the low-molecular material particle caused by the crystallization; thus a void is created, and the white turbid state (A) is reproduced.

Next, in the aspect in which color tone reversibly changes depending upon temperature, the low-molecular organic material before melting is a leuco dye and a reversible developer (hereinafter otherwise referred to as "developer"), and the low-molecular organic material after melted and before crystallization is the leuco dye and the reversible developer and the color tone reversibly changes by heat between a transparent state and a color-developed state.

Figure 5A:
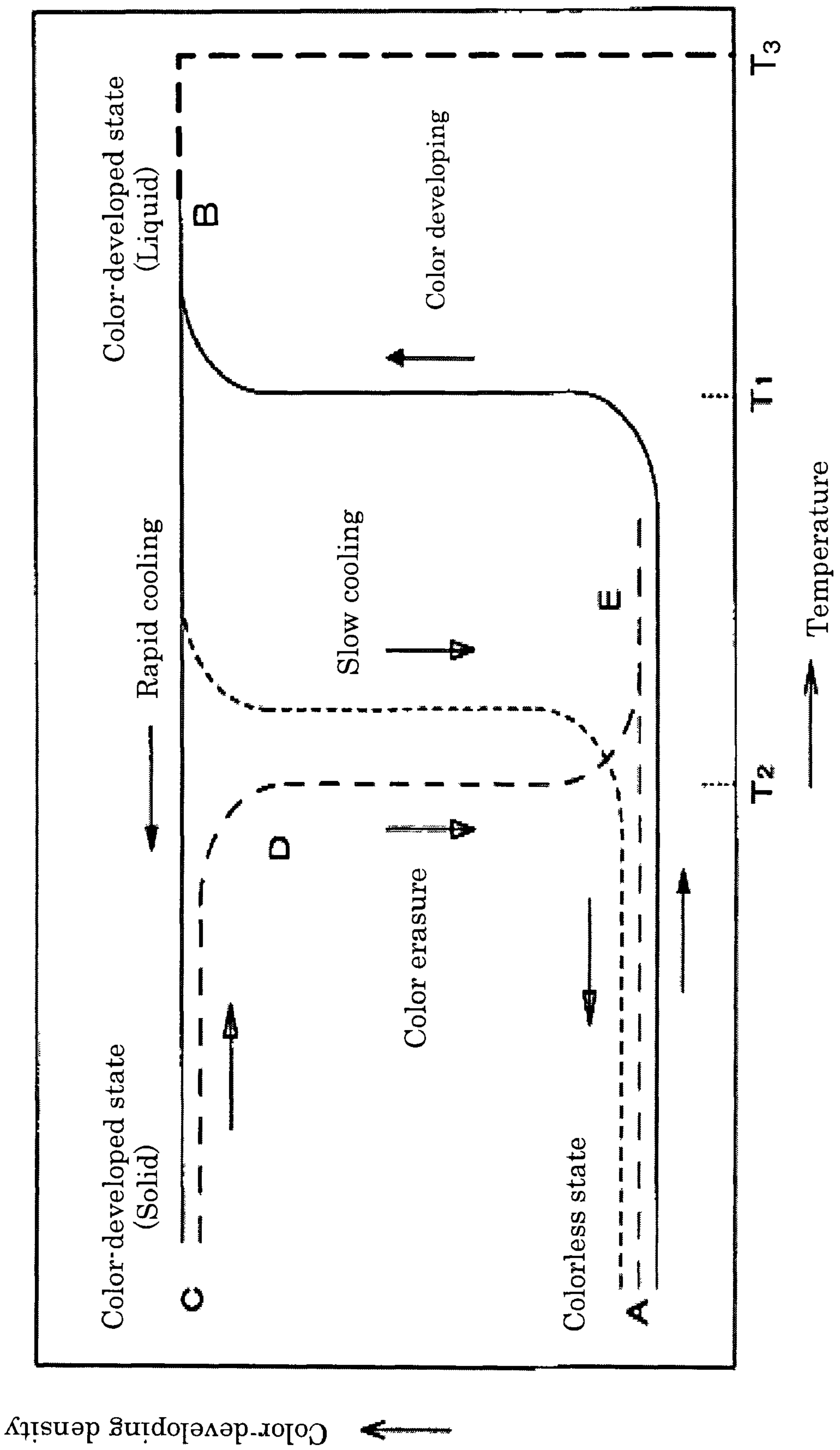
FIG. 5A is a graph showing the color developing—color erasing properties of a thermoreversible recording medium.
Figure 5B:
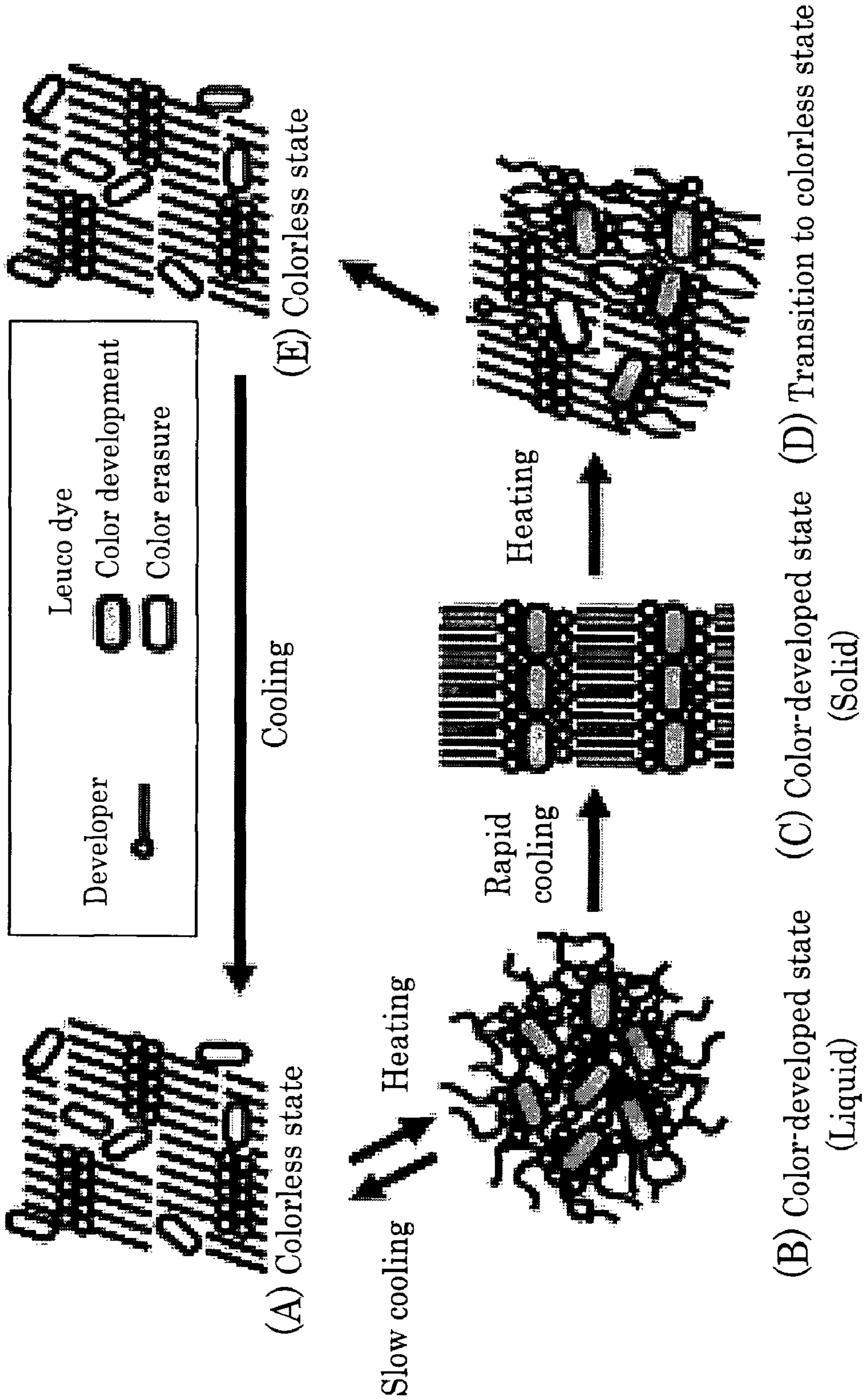
FIG. 5B is a schematic explanatory diagram showing the mechanism of a color developing—color erasing change of the thermoreversible recording medium.

FIG. 5A shows an example of the temperature—color-developing density change curve of a thermoreversible recording medium which has a thermoreversible recording layer formed of the resin containing the leuco dye and the developer. FIG. 5B shows the color-developing and color-erasing mechanism of the thermoreversible recording medium which reversibly changes by heat between a transparent state and a color-developed state.

First of all, when the recording layer in a colorless state (A) is raised in temperature, the leuco dye and the developer melt and mix at the melting temperature $T_1$, thereby developing color, and the recording layer thusly comes into a melted and color-developed state (B). When the recording layer in the melted and color-developed state (B) is rapidly cooled, the recording layer can be lowered in temperature to room temperature, with its color-developed state kept, and it thusly comes into a color-developed state (C) where its color-developed state is stabilized and fixed. Whether or not this color-developed state is obtained depends upon the temperature decreasing rate from the temperature in the melted state: in the case of slow cooling, the color is erased in the temperature decreasing process, and the recording layer returns to the colorless state (A) it was in at the beginning, or comes into a state where the density is low in comparison with the density in the color-developed state (C) produced by rapid cooling. When the recording layer in the color-developed state (C) is raised in temperature again, the color is erased at the temperature $T_2$ lower than the color-developing temperature (from D to E), and when the recording layer in this state is lowered in temperature, it returns to the colorless state (A) it was in at the beginning.

The color-developed state (C) obtained by rapidly cooling the recording layer in the melted state is a state where the leuco dye and the developer are mixed together such that their molecules can undergo contact reaction, which is often a solid state. This state is a state where a melted mixture (color-developing mixture) of the leuco dye and the developer crystallizes, and thus color development is maintained, and it is inferred that the color development is stabilized by the formation of this structure. Meanwhile, the colorless state is a state where the leuco dye and the developer are phase-separated. It is inferred that this state is a state where molecules of at least one of the compounds gather to constitute a domain or crystallize, and thus a stabilized state where the leuco dye and the developer are separated from each other by the occurrence of the flocculation or the crystallization. In many cases, phase separation of the leuco dye and the developer is brought about, and the developer crystallizes in this manner, thereby enabling color erasure with greater completeness.

As to both the color erasure by slow cooling from the melted state and the color erasure by temperature increase from the color-developed state shown in FIG. 5A, the aggregation structure changes at $T_2$, causing phase separation and crystallization of the developer.

Further, in FIG. 5A, when the temperature of the recording layer is repeatedly raised to the temperature $T_3$ higher than or equal to the melting temperature $T_1$, there may be caused such an erasure failure that an image cannot be erased even if the recording layer is heated to an erasing temperature. It is inferred that this is because the developer thermally decomposes and thus hardly flocculates or crystallizes, which makes it difficult for the developer to separate from the leuco dye. Degradation of the thermoreversible recording medium caused by repeated use can be reduced by decreasing the difference between the melting temperature $T_1$ and the temperature $T_3$ in FIG. 5A when the thermoreversible recording medium is heated.

[Thermoreversible Recording Medium]

The thermoreversible recording medium used in the image processing method of the present invention includes at least a support, a reversible thermosensitive recording layer and a photothermal conversion layer, and further includes other layers suitably selected in accordance with the necessity, such as a protective layer, an intermediate layer, an oxygen blocking layer, an undercoat layer, a back layer, an adhesion layer, a tackiness layer, a colored layer, an air layer and a light-reflecting layer. Each of these layers may have a single-layer structure or a laminated structure.

The thermoreversible recording medium is necessary to have a layer for absorbing a semiconductor laser beam, such as a photothermal conversion layer or a recording layer in which a photothermal conversion material is added.

—Support—

The shape, structure, size and the like of the support are not particularly limited and may be suitably selected in accordance with the intended use. Examples of the shape include plate-like shapes; the structure may be a single-layer structure or a laminated structure; and the size may be suitably selected according to the size of the thermoreversible recording medium, etc.

Examples of the material for the support include inorganic materials and organic materials.

Examples of the inorganic materials include glass, quartz, silicon, silicon oxide, aluminum oxide, $SiO_2$ and metals.

Examples of the organic materials include paper, cellulose derivatives such as cellulose triacetate, synthetic paper, and films made of polyethylene terephthalate, polycarbonates, polystyrene, polymethyl methacrylate, etc.

Each of the inorganic materials and the organic materials may be used alone or in combination with two or more. Among these materials, the organic materials are preferable, particularly films made of polyethylene terephthalate, polycarbonates, polymethyl methacrylate, etc. are preferable. Of these, polyethylene terephthalate is particularly preferable.

It is desirable that the support be subjected to surface modification by means of corona discharge, oxidation reaction (using chromic acid, for example), etching, facilitation of adhesion, antistatic treatment, etc. for the purpose of improving the adhesiveness of a coating layer.

Also, it is desirable to color the support white by adding, for example, a white pigment such as titanium oxide to the support.

The thickness of the support is not particularly limited and may be suitably selected in accordance with the intended use, with the range of 10 μm to 2,000 μm being preferable and the range of 50 μm to 1,000 μm being more preferable.

—Thermoreversible Recording Layer—

The thermoreversible recording layer (which may be hereinafter referred to simply as "recording layer") includes at least a material in which transparency or color tone reversibly changes depending upon temperature, and further includes other components in accordance with the necessity.

The material in which transparency or color tone reversibly changes depending upon temperature is a material capable of exhibiting a phenomenon in which visible changes are reversibly produced by temperature change; and the material can relatively change into a color-developed state and into a colorless state, depending upon the heating temperature and the cooling rate after heating. In this case, the visible changes can be classified into changes in the state of color and changes in shape. The changes in the state of color stem from changes in transmittance, reflectance, absorption wavelength, the degree of diffusion, etc., for example. The state of the color of the thermoreversible recording medium, in effect, changes due to a combination of these changes.

The material in which transparency or color tone reversibly changes depending upon temperature is not particularly limited and may be suitably selected from known materials. For example, two or more types of polymers are mixed and the color of the mixture becomes transparent or white turbid depending on compatibility (refer to JP-A 61-258853), a material taking advantage of phase change of a liquid crystal polymer (refer to JP-A 62-66990), a material which comes into a state of first color at a first specific temperature which is higher than normal temperature, and comes into a state of second color by heating at a second specific temperature which is higher than the first specific temperature, and then cooling.

Among the known materials, a material in which the color changes according to the first specific temperature and the second specific temperature is particularly preferable in that the temperature can be easily controlled and high contrast can be obtained.

Examples thereof include a material which comes into a transparent state at a first specific temperature and comes into a white turbid state at a second specific temperature (refer to JP-A No. 55-154198); a material which develops color at a second specific temperature and loses the color at a first specific temperature (refer to JP-A Nos. 04-224996, 04-247985 and 04-267190); a material which comes into a white turbid state at a first specific temperature and comes into a transparent state at a second specific temperature (refer to JP-A No. 03-169590); and a material which develops a color (black, red, blue, etc.) at a first specific temperature and loses the color at a second specific temperature (refer to JP-A Nos. 02-188293 and 02-188294).

Among these, a thermoreversible recording medium including a resin base material and a low-molecular organic material such as a higher fatty acid dispersed in the resin base material is advantageous in that a second specific temperature and a first specific temperature are relatively low, and so erasure and recording can be performed with low energy. Also, since the color-developing and color-erasing mechanism is a physical change which depends upon solidification of the resin and crystallization of the low-molecular organic material, the thermoreversible recording medium offers high environment resistance.

Additionally, a thermoreversible recording medium, which uses the after-mentioned leuco dye and reversible developer and which develops color at a second specific temperature and loses the color at a first specific temperature, exhibits a transparent state and a color-developed state reversibly and exhibits black, blue or other color in the color-developed state; therefore, a high-contrast image can be obtained.

The low-molecular organic material (which is dispersed in the resin base material and which comes into a transparent state at the first specific temperature and comes into a white turbid state at the second specific temperature) in the thermoreversible recording medium is not particularly limited and may be suitably selected in accordance with the intended use, as long as it can change from a polycrystalline material to a single-crystal material by heat in the recording layer. Generally, a material having a melting temperature of approximately 30° C. to 200° C. can be used therefor, preferably a material having a melting temperature of 50° C. to 150° C.

Such a low-molecular organic material is not particularly limited and may be suitably selected in accordance with the intended use. Examples thereof include alkanols; alkanediols; halogenated alkanols and halogenated alkanediols; alkylamines; alkanes; alkenes; alkines; halogenated alkanes; halogenated alkenes; halogenated alkines; cycloalkanes; cycloalkenes; cycloalkines; saturated or unsaturated monocarboxylic/dicarboxylic acids, esters thereof, amides thereof and ammonium salts thereof; saturated or unsaturated halogenated fatty acids, esters thereof, amides thereof and ammonium salts thereof; arylcarboxylic acids, esters thereof, amides thereof and ammonium salts thereof; halogenated arylcarboxylic acids, esters thereof, amides thereof and ammonium salts thereof, thioalcohols; thiocarboxylic acids, esters thereof, amines thereof and ammonium salts thereof; and carboxylic acid esters of thioalcohols. Each of these may be used alone or in combination with two or more.

Each of these compounds preferably has 10 to 60 carbon atoms, more preferably 10 to 38 carbon atoms, most preferably 10 to 30 carbon atoms. Alcohol groups in the esters may or may not be saturated, and may be halogen-substituted.

The low-molecular organic material preferably has in its molecules at least one selected from oxygen, nitrogen, sulfur and halogens, for example groups such as —OH, —COOH, —CONH—, —COOR, —NH—, —$NH_2$, —S—, —S—S— and —O—, and halogen atoms.

More specific examples of these compounds include higher fatty acids such as lauric acid, dodecanoic acid, myristic acid, pentadecanoic acid, palmitic acid, stearic acid, behenic acid, nonadecanoic acid, arachidonic acid and oleic acid; and esters of higher fatty acids such as methyl stearate, tetradecyl stearate, octadecyl stearate, octadecyl laurate, tetradecyl palmitate and dodecyl behenate. The low-molecular organic material used in the third aspect of the image processing method is preferably selected from higher fatty acids among these compounds, more preferably higher fatty acids having 16 or more carbon atoms such as palmitic acid, stearic acid, behenic acid and lignoceric acid, even more preferably higher fatty acids having 16 to 24 carbon atoms.

To increase the range of temperatures at which the thermoreversible recording medium can be made transparent, the above-mentioned low-molecular organic materials may be suitably combined together, or any of the above-mentioned low-molecular organic materials may be combined with other material having a different melting temperature. Use of such materials is disclosed in JP-A Nos. 63-39378 and 63-130380, JP-B No. 2615200 and so forth. It should, however, be noted that the use of such materials in the present invention is not confined thereto.

The resin base material forms a layer in which the low-molecular organic material is uniformly dispersed and held, and the resin base material affects the transparency when the thermoreversible recording medium becomes most transparent. For this reason, the resin base material is preferably a resin which is highly transparent, mechanically stable and excellent in film-forming property.

Such a resin is not particularly limited and may be suitably selected in accordance with the intended use. Examples thereof include polyvinyl chloride; vinyl chloride copolymers such as vinyl chloride-vinyl acetate copolymers, vinyl chloride-vinyl acetate-vinyl alcohol copolymers, vinyl chloride-vinyl acetate-maleic acid copolymers and vinyl chloride-acrylate copolymers; polyvinylidene chloride; vinylidene chloride copolymers such as vinylidene chloride-vinyl chloride copolymers and vinylidene chloride-acrylonitrile copolymers; polyesters; polyamides; polyacrylates, polymethacrylates and acrylate-methacrylate copolymers; and silicone resins. Each of these may be used alone or in combination with two or more.

The mass ratio of the low-molecular organic material to the resin (resin base material) in the recording layer is preferably in the range of approximately 2:1 to 1:16, more preferably in the range of approximately 1:2 to 1:8.

When the amount of the resin contained is so small as to be outside the mass ratio 2:1, it may be difficult to form a film in which the low-molecular organic material is held in the resin base material. When the amount of the resin contained is so large as to be outside the mass ratio 1:16, the amount of the low-molecular organic material is small, and thus it may be difficult to make the recording layer opaque.

Besides the low-molecular organic material and the resin, other components such as a high-boiling solvent and a surfactant may be added into the recording layer for the purpose of making it easier to record a transparent image.

The method for producing the recording layer is not particularly limited and may be suitably selected in accordance with the intended use. For instance, the recording layer can be produced as follows: a solution dissolving the resin base material and the low-molecular organic material, or a dispersion solution produced by dispersing the low-molecular organic material in the form of fine particles into a solution containing the resin base material (a solvent contained herein does not dissolve at least one selected from the above-mentioned low-molecular organic materials) is applied onto the support and dried.

The solvent used for producing the recording layer is not particularly limited and may be suitably selected according to the types of the resin base material and the low-molecular organic material. Examples of the solvent include tetrahydrofuran, methyl ethyl ketone, methyl isobutyl ketone, chloroform, carbon tetrachloride, ethanol, toluene and benzene. When the solution is used, as well as when the dispersion solution is used, the low-molecular organic material is deposited in the form of fine particles and present in a dispersed state in the recording layer obtained.

Composed of the leuco dye and the reversible developer, the low-molecular organic material in the thermoreversible recoding medium may develop color at a second specific temperature and lose the color at a first specific temperature. The leuco dye is a dye precursor which is colorless or pale per se. The leuco dye is not particularly limited and may be suitably selected from known leuco dyes. Examples thereof include leuco compounds based upon triphenylmethane phthalide, triallylmethane, fluoran, phenothiazine, thiofluoran, xanthene, indophthalyl, spiropyran, azaphthalide, chromenopyrazole, methines, rhodamineanilinolactam, rhodaminelactam, quinazoline, diazaxanthene and bislactone. Among these, leuco dyes based upon fluoran and phthalide are particularly preferable in that they are excellent in color-developing and color-erasing property, colorfulness and storage ability. Each of these may be used alone or in combination with two or more, and the thermoreversible recording medium can be made suitable for multicolor or full-color recording by providing a layer which develops color with a different color tone.

The reversible developer is not particularly limited and may be suitably selected in accordance with the intended use, as long as it is capable of reversibly developing and erasing color by means of heat. Suitable examples thereof include a compound having in its molecules at least one of the following structures: a structure (1) having such a color-developing ability as makes the leuco dye develop color (for example, a phenolic hydroxyl group, a carboxylic acid group, a phosphoric acid group, etc.); and a structure (2) which controls cohesion among molecules (for example, a structure in which long-chain hydrocarbon groups are linked together). In the bonded site, the long-chain hydrocarbon group may be bonded via a divalent or more bond group containing a hetero atom. Additionally, the long-chain hydrocarbon groups may contain at least either similar linking groups or aromatic groups.

For the structure (1) having such a color-developing ability as makes the leuco dye develop color, phenol is particularly suitable.

For the structure (2) which controls cohesion among molecules, long-chain hydrocarbon groups having 8 or more carbon atoms, preferably 11 or more carbon atoms, are suitable, and the upper limit of the number of carbon atoms is preferably 40 or less, more preferably 30 or less.

Among the reversible developers, phenolic compounds represented by General Formula (1) are desirable, and phenolic compounds represented by General Formula (2) are more desirable.

General Formula (1)

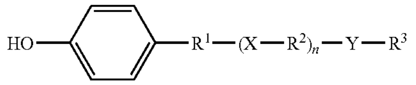

General Formula (2)

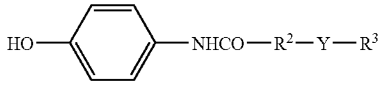

In General Formulae (1) and (2), $R^1$ denotes a single bond or an aliphatic hydrocarbon group having 1 to 24 carbon atoms. $R^2$ denotes an aliphatic hydrocarbon group having two or more carbon atoms, which may have a substituent, and the number of the carbon atoms is preferably 5 or greater, more preferably 10 or greater. $R^3$ denotes an aliphatic hydrocarbon group having 1 to 35 carbon atoms, and the number of the carbon atoms is preferably 6 to 35, more preferably 8 to 35. Each of these aliphatic hydrocarbon groups may be provided alone or in combination with two or more.

The sum of the numbers of carbon atoms which $R^1$, $R^2$ and $R^3$ have is not particularly limited and may be suitably selected in accordance with the intended use, with its lower limit being preferably 8 or greater, more preferably 11 or greater, and its upper limit being preferably 40 or less, more preferably 35 or less.

When the sum of the numbers of carbon atoms is less than 8, color-developing stability or color-erasing ability may degrade.

Each of the aliphatic hydrocarbon groups may be a straight-chain group or a branched-chain group and may have an unsaturated bond, with preference being given to a straight-chain group. Examples of the substituent bonded to the aliphatic hydrocarbon group include hydroxyl group, halogen atoms and alkoxy groups.

X and Y may be identical or different, each denoting an N atom-containing or O atom-containing divalent group. Specific examples thereof include oxygen atom, amide group, urea group, diacylhydrazine group, diamide oxalate group and acylurea group, with amide group and urea group being preferable.

"n" denotes an integer of 0 to 1.

It is desirable that the electron-accepting compound (developer) be used together with a compound as a color erasure accelerator having in its molecules at least one of —NHCO— group and —OCONH— group because intermolecular interaction is induced between the color erasure accelerator and the developer in a process of producing a colorless state and thus there is an improvement in color-developing and color-erasing property.

For the reversible thermosensitive recording layer, a binder resin and, if necessary, additives for improving or controlling the coating properties and color-developing and color-erasing properties of the recording layer may be used. Examples of these additives include a surfactant, a conductive agent, a filling agent, an antioxidant, a light stabilizer, a color development stabilizer and a color erasure accelerator.

The binder resin is not particularly limited and may be suitably selected in accordance with the intended use, as long as it enables the recording layer to be bonded onto the support. For instance, one of conventionally known resins or a combination of two or more thereof may be used for the binder resin. Among these resins, resins capable of being cured by heat, an ultraviolet ray, an electron beam or the like are preferable in that the durability at the time of repeated use can be improved, with particular preference being given to thermosetting resins each containing an isocyanate-based compound or the like as a cross-linking agent. Examples of the thermosetting resins include a resin having a group which reacts with a cross-linking agent, such as a hydroxyl group or carboxyl group, and a resin produced by copolymerizing a hydroxyl group-containing or carboxyl group-containing monomer and other monomer. Specific examples of such thermosetting resins include phenoxy resins, polyvinyl butyral resins, cellulose acetate propionate resins, cellulose acetate butyrate resins, acrylpolyol resins, polyester polyol resins and polyurethane polyol resins, with particular preference being given to acrylpolyol resins, polyester polyol resins and polyurethane polyol resins.

The mixture ratio (mass ratio) of the color developer to the binder resin in the recording layer is preferably in the range of 1:0.1 to 1:10. When the amount of the binder resin is too small, the recording layer may be deficient in thermal strength. When the amount of the binder resin is too large, it is problematic because the color-developing density decreases.

The cross-linking agent is not particularly limited and may be suitably selected in accordance with the intended use, and examples thereof include isocyanates, amino resins, phenol resins, amines and epoxy compounds. Among these, isocyanates are preferable, and polyisocyanate compounds each having a plurality of isocyanate groups are particularly preferable.

As to the amount of the cross-linking agent added in relation to the amount of the binder resin, the ratio of the number of functional groups contained in the cross-linking agent to the number of active groups contained in the binder resin is preferably in the range of 0.01:1 to 2:1. When the amount of the cross-linking agent added is so small as to be outside this range, sufficient thermal strength cannot be obtained. When the amount of the cross-linking agent added is so large as to be outside this range, there is an adverse effect on the color-developing and color-erasing properties.

Further, as a cross-linking promoter, a catalyst utilized in this kind of reaction may be used.

The gel fraction of any of the thermosetting resins in the case where thermally cross-linked is preferably 30% or greater, more preferably 50% or greater, even more preferably 70% or greater. When the gel fraction is less than 30%, an adequate cross-linked state cannot be produced, and thus there may be degradation of durability.

As to a method for distinguishing between a cross-linked state and a non-cross-linked state of the binder resin, these two states can be distinguished by immersing a coating film in a solvent having high dissolving ability, for example. Specifically, with respect to the binder resin in a non-cross-linked state, the resin dissolves in the solvent and thus does not remain in a solute.

The above-mentioned other components in the recording layer are not particularly limited and may be suitably selected in accordance with the intended use. For instance, a surfactant, a plasticizer and the like are suitable therefor in that recording of an image can be facilitated.

To a solvent, a coating solution dispersing device, a recording layer applying method, a drying and hardening method and the like used for the recording layer coating solution, those that are known can be applied.

To prepare the recording layer coating solution, materials may be together dispersed into a solvent using the dispersing device; alternatively, the materials may be independently dispersed into respective solvents and then the solutions may be mixed together. Further, the ingredients may be heated and dissolved, and then they may be precipitated by rapid cooling or slow cooling.

The method for forming the recording layer is not particularly limited and may be suitably selected in accordance with the intended use. Suitable examples thereof include a method (1) of applying onto a support a recording layer coating solution in which the resin, the electron-donating color-forming compound and the electron-accepting compound are dissolved or dispersed in a solvent, then cross-linking the coating solution while or after forming it into a sheet or the like by evaporation of the solvent; a method (2) of applying onto a support a recording layer coating solution in which the electron-donating color-forming compound and the electron-accepting compound are dispersed in a solvent dissolving only the resin, then cross-linking the coating solution while or after forming it into a sheet or the like by evaporation of the solvent; and a method (3) of not using a solvent and heating and melting the resin, the electron-donating color-forming compound and the electron-accepting compound so as to mix, then cross-linking this melted mixture after forming it into a sheet or the like and cooling it. In each of these methods, it is also possible to produce the recording layer as a thermoreversible recording medium in the form of a sheet, without using the support.

The solvent used in (1) or (2) cannot be unequivocally defined, as it is affected by the types, etc. of the resin, the electron-donating color-forming compound and the electron-accepting compound. Examples thereof include tetrahydrofuran, methyl ethyl ketone, methyl isobutyl ketone, chloroform, carbon tetrachloride, ethanol, toluene and benzene.

Additionally, the electron-accepting compound is present in the recording layer, being dispersed in the form of particles.

Pigments, an antifoaming agent, a dispersant, a slip agent, an antiseptic agent, a cross-linking agent, a plasticizer and the like may be added into the recording layer coating solution, for the purpose of exhibiting high performance as a coating material.

The coating method for the recording layer is not particularly limited and may be suitably selected in accordance with the intended use. For instance, a support which is continuous in the form of a roll or which has been cut into the form of a sheet is conveyed, and the support is coated with the recording layer by a known method such as blade coating, wire bar coating, spray coating, air knife coating, bead coating, curtain coating, gravure coating, kiss coating, reverse roll coating, dip coating or die coating.

The drying conditions of the recording layer coating solution are not particularly limited and may be suitably selected in accordance with the intended use. For instance, the recording layer coating solution is dried at room temperature to a temperature of 140° C., for approximately 10 sec to 10 min.

The thickness of the recording layer is not particularly limited and may be suitably selected in accordance with the intended use. For instance, it is preferably 1 μm to 20 μm, more preferably 3 μm to 15 μm. When the recording layer is too thin, the contrast of an image may lower because the color-developing density lowers. When the recording layer is too thick, the heat distribution in the layer increases, a portion which does not reach a color-developing temperature and so does not develop color is created, and thus a desired color-developing density may be unable to be obtained.

—Photothermal Conversion Layer—

The photothermal conversion layer is a layer having a function to absorb laser beams and generate heat and contains at least a photothermal conversion material having a function to absorb laser beams and generate heat.

The photothermal conversion material is broadly classified into inorganic materials and organic materials.

Examples of the inorganic materials include carbon black, metals such as Ge, Bi, In, Te, Se, and Cr, or semi-metals thereof or alloys thereof. Each of these inorganic materials is formed into a layer form by vacuum evaporation method or by bonding a particulate material to a layer surface using a resin or the like.

For the organic material, various dyes can be suitably used in accordance with the wavelength of light to be absorbed, however, when a laser diode is used as a light source, a near-infrared absorption pigment having an absorption peak near wavelengths of 700 nm to 1,500 nm. Specific examples thereof include cyanine pigments, quinone pigments, quinoline derivatives of indonaphthol, phenylene diamine-based nickel complexes, phthalocyanine compounds, and naphthalocyanine compounds. To secure durability against repeated recording and erasure of an image, it is preferable to select a photothermal conversion material that is excellent in heat resistance.

Each of the photothermal conversion materials may be used alone or in combination with two or more. The photothermal conversion material may be mixed in the recording layer. In this case, the recording layer also serves as the photothermal conversion layer. Among these, in view of thermal durability against repeated image recording and erasure and light resistance of a medium, phthalocyanine pigment compounds are particularly preferable, because of high stability against heat and light.

The amount of the photothermal conversion material in the total mass of a layer containing the photothermal conversion material is preferably 0.0005% by mass to 0.1% by mass, and more preferably 0.001% by mass to 0.02% by mass. When the amount of the photothermal conversion material is large, the background of a thermoreversible recording medium is colored. When the amount is small, a laser beam is less absorbed in a thermoreversible recording medium, and sensitivity of image recording and erasure is lowered.

When the photothermal conversion layer is formed, the photothermal conversion material is typically used in combination with a resin. The resin used in the photothermal conversion layer is not particularly limited and may be suitably selected from among those known in the art, as long as it can maintain the inorganic material and the organic material therein, however, thermoplastic resins and thermosetting resins are preferable.

To a solvent, a coating solution dispersing device, a photothermal conversion layer applying method, a drying method and the like used for a photothermal conversion layer, those that are known and used for the recording layer can be applied.

The thickness of the photothermal conversion layer is not particularly limited and may be suitably selected in accordance with the intended use; it is preferably 0.1 μm to 10 μm.

<Protective Layer>

In the thermoreversible recording medium of the present invention, it is desirable that a protective layer be provided on the recording layer, for the purpose of protecting the recording layer. The protective layer is not particularly limited and may be suitably selected in accordance with the intended use. For instance, the protective layer may be formed from one or more layers, and it is preferably provided on the outermost surface that is exposed.

The protective layer contains a binder resin and further contains other components such as a filler, a lubricant and a coloring pigment in accordance with the necessity.

The resin in the protective layer is not particularly limited and may be suitably selected in accordance with the intended use. For instance, the resin is preferably a thermosetting resin, an ultraviolet (UV) curable resin, an electron beam curable resin, etc., with particular preference being given to an ultraviolet (UV) curable resin and a thermosetting resin.

The UV-curable resin is capable of forming a very hard film after cured, and reducing damage done by physical contact of the surface and deformation of the medium caused by laser heating; therefore, it is possible to obtain a thermoreversible recording medium superior in durability against repeated use.

Although slightly inferior to the UV-curable resin, the thermosetting resin makes it possible to harden the surface as well and is superior in durability against repeated use.

The UV-curable resin is not particularly limited and may be suitably selected from known UV-curable resins in accordance with the intended use. Examples thereof include oligomers based upon urethane acrylates, epoxy acrylates, polyester acrylates, polyether acrylates, vinyls and unsaturated polyesters; and monomers such as monofunctional and multifunctional acrylates, methacrylates, vinyl esters, ethylene derivatives and allyl compounds. Among these, multifunctional, i.e. tetrafunctional or higher, monomers and oligomers are particularly preferable. By mixing two or more of these monomers or oligomers, it is possible to suitably adjust the hardness, degree of contraction, flexibility, coating strength, etc. of the resin film.

To cure the monomers and the oligomers with an ultraviolet ray, it is necessary to use a photopolymerization initiator or a photopolymerization accelerator.

The amount of the photopolymerization initiator or the photopolymerization accelerator added is preferably 0.1% by mass to 20% by mass, more preferably 1% by mass to 10% by mass, in relation to the total mass of the resin component of the protective layer.

Ultraviolet irradiation for curing the ultraviolet curable resin can be conducted using a known ultraviolet irradiator, and examples of the ultraviolet irradiator include one equipped with a light source, lamp fittings, a power source, a cooling device, a conveyance device, etc.

Examples of the light source include a mercury-vapor lamp, a metal halide lamp, a potassium lamp, a mercury-xenon lamp and a flash lamp. The wavelength of the light source may be suitably selected according to the ultraviolet absorption wavelength of the photopolymerization initiator and the photopolymerization accelerator added to the thermoreversible recording medium composition.

The conditions of the ultraviolet irradiation are not particularly limited and may be suitably selected in accordance with the intended use. For instance, it is advisable to decide the lamp output, the conveyance speed, etc. according to the irradiation energy necessary to cross-link the resin.

In order to improve the conveyance capability, a releasing agent such as a silicone having a polymerizable group, a silicone-grafted polymer, wax or zinc stearate; or a lubricant such as silicone oil may be added. The amount of any of these added is preferably 0.01% by mass to 50% by mass, more preferably 0.1% by mass to 40% by mass, in relation to the total mass of the resin component of the protective layer. Each of these may be used alone or in combination with two or more. Additionally, in order to prevent static electricity, a conductive filler is preferably used, more preferably a needle-like conductive filler.

The particle diameter of the inorganic pigment is preferably 0.01 μm to 10.0 μm, more preferably 0.05 μm to 8.0 μm. The amount of the inorganic pigment added is preferably 0.001 parts by mass to 2 parts by mass, more preferably 0.005 parts by mass to 1 part by mass, in relation to 1 part by mass of the heat-resistant resin.

Further, a surfactant, a leveling agent, an antistatic agent and the like that are conventionally known may be contained in the protective layer as additives.

Also, as the thermosetting resin, a resin similar to the binder resin used for the recording layer can be suitably used, for instance.

A polymer having an ultraviolet absorbing structure (hereinafter otherwise referred to as "ultraviolet absorbing polymer") may also be used.

Here, the polymer having an ultraviolet absorbing structure denotes a polymer having an ultraviolet absorbing structure (e.g. ultraviolet absorbing group) in its molecules. Examples of the ultraviolet absorbing structure include salicylate structure, cyanoacrylate structure, benzotriazole structure and benzophenone structure. Among these, benzotriazole structure and benzophenone structure are particularly preferable for their superior light resistance.

It is desirable that the thermosetting resin be cross-linked. Accordingly, the thermosetting resin is preferably a resin having a group which reacts with a curing agent, such as hydroxyl group, amino group or carboxyl group, particularly preferably a hydroxyl group-containing polymer. To increase the strength of a layer which contains the polymer having an ultraviolet absorbing structure, use of the polymer having a hydroxyl value of 10 mgKOH/g or greater is preferable because adequate coating strength can be obtained, more preferably use of the polymer having a hydroxyl value of 30 mgKOH/g or greater, even more preferably use of the polymer having a hydroxyl value of 40 mgKOH/g or greater. By making the protective layer have adequate coating strength, it is possible to reduce degradation of the recording medium even when erasure and printing are repeatedly carried out.

As the curing agent, a curing agent similar to the one used for the recording layer can be suitably used.

To a solvent, a coating solution dispersing device, a protective layer applying method, a drying method and the like used for the protective layer coating solution, those that are known and used for the recording layer can be applied. When an ultraviolet curable resin is used, a curing step by means of the ultraviolet irradiation with which coating and drying have been carried out is required, in which case an ultraviolet irradiator, a light source and the irradiation conditions are as described above.

The thickness of the protective layer is preferably 0.1 μm to 20 μm, more preferably 0.5 μm to 10 μm, even more preferably 1.5 μm to 6 μm. When the thickness is less than 0.1 μm, the protective layer cannot fully perform the function as a protective layer of a thermoreversible recording medium, the thermoreversible recording medium easily degrades through repeated use with heat, and thus it may become unable to be repeatedly used. When the thickness is greater than 20 μm, it is impossible to pass adequate heat to a thermosensitive section situated under the protective layer, and thus printing and erasure of an image by heat may become unable to be sufficiently performed.

<Intermediate Layer>

In the present invention, it is desirable to provide an intermediate layer between the recording layer and the protective layer, for the purpose of improving adhesiveness between the recording layer and the protective layer, preventing change in the quality of the recording layer caused by application of the protective layer, and preventing the additives in the protective layer from transferring to the recording layer. This makes it possible to improve the ability to store a color-developing image.

The intermediate layer contains at least a binder resin and further contains other components such as a filler, a lubricant and a coloring pigment in accordance with the necessity.

The binder resin is not particularly limited and may be suitably selected in accordance with the intended use. For the binder resin, the binder resin used for the recording layer or a resin component such as a thermoplastic resin or thermosetting resin may be used. Examples of the resin component include polyethylene, polypropylene, polystyrene, polyvinyl alcohol, polyvinyl butyral, polyurethane, saturated polyesters, unsaturated polyesters, epoxy resins, phenol resins, polycarbonates and polyamides.

It is desirable that the intermediate layer contain an ultraviolet absorber. For the ultraviolet absorber, any one of an organic compound and an inorganic compound may be used.

Also, an ultraviolet absorbing polymer may be used, and this may be cured by means of a cross-linking agent. As these compounds, compounds similar to those used for the protective layer can be suitably used.

The thickness of the intermediate layer is preferably 0.1 μm to 20 μm, more preferably 0.5 μm to 5 μm. To a solvent, a coating solution dispersing device, an intermediate layer applying method, an intermediate layer drying and hardening method and the like used for the intermediate layer coating solution, those that are known and used for the recording layer can be applied.

<Under Layer>

In the present invention, an under layer may be provided between the recording layer and the support, for the purpose of effectively utilizing applied heat for high sensitivity, or improving adhesiveness between the support and the recording layer, and preventing permeation of recording layer materials into the support.

The under layer contains at least hollow particles, also contains a binder resin and further contains other components in accordance with the necessity.

Examples of the hollow particles include single hollow particles in which only one hollow portion is present in each particle, and multi hollow particles in which numerous hollow portions are present in each particle. These types of hollow particles may be used independently or in combination.

The material for the hollow particles is not particularly limited and may be suitably selected in accordance with the intended use, and suitable examples thereof include thermoplastic resins. For the hollow particles, suitably produced hollow particles may be used, or a commercially available product may be used. Examples of the commercially available product include MICROSPHERE R-300 (produced by Matsumoto Yushi-Seiyaku Co., Ltd.); ROPAQUE HP 1055 and ROPAQUE HP433J (both of which are produced by Zeon Corporation); and SX866 (Produced by JSR Corporation).

The amount of the hollow particles added into the under layer is not particularly limited and may be suitably selected in accordance with the intended use, and it is preferably 10% by mass to 80% by mass, for instance.

For the binder resin, a resin similar to the resin used for the recording layer or used for the layer which contains the polymer having an ultraviolet absorbing structure can be used.

The under layer may contain at least one of an organic filler and an inorganic filler such as calcium carbonate, magnesium carbonate, titanium oxide, silicon oxide, aluminum hydroxide, kaolin or talc.

Besides, the under layer may contain a lubricant, a surfactant, a dispersant and so forth.

The thickness of the under layer is not particularly limited and may be suitably selected in accordance with the intended use, with the range of 0.1 μm to 50 μm being desirable, the range of 2 μm to 30 μm being more desirable, and the range of 12 μm to 24 μm being even more desirable.

<Back Layer>

In the present invention, for the purpose of preventing curl and static charge on the thermoreversible recording medium and improving the conveyance capability, a back layer may be provided on the side of the support opposite to the surface where the recording layer is formed.

The back layer contains at least a binder resin and further contains other components such as a filler, a conductive filler, a lubricant and a coloring pigment in accordance with the necessity.

The binder resin is not particularly limited and may be suitably selected in accordance with the intended use. For instance, the binder resin is any one of a thermosetting resin, an ultraviolet (UV) curable resin, an electron beam curable resin, etc., with particular preference being given to an ultraviolet (UV) curable resin and a thermosetting resin.

For the ultraviolet curable resin, the thermosetting resin, the filler, the conductive filler and the lubricant, ones similar to those used for the recording layer, the protective layer or the intermediate layer can be suitably used.

<Adhesion Layer or Tackiness Layer>

In the present invention, the thermoreversible recording medium can be produced as a thermoreversible recording label by providing an adhesion layer or a tackiness layer on the surface of the support opposite to the surface where the recording layer is formed. The material for the adhesion layer or the tackiness layer can be selected from commonly used materials.

The material for the adhesion layer or the tackiness layer is not particularly limited and may be suitably selected in accordance with the intended use. Examples thereof include urea resins, melamine resins, phenol resins, epoxy resins, vinyl acetate resins, vinyl acetate-acrylic copolymers, ethylene-vinyl acetate copolymers, acrylic resins, polyvinyl ether resins, vinyl chloride-vinyl acetate copolymers, polystyrene resins, polyester resins, polyurethane resins, polyamide resins, chlorinated polyolefin resins, polyvinyl butyral resins, acrylic acid ester copolymers, methacrylic acid ester copolymers, natural rubbers, cyanoacrylate resins and silicone resins.

The material for the adhesion layer or the tackiness layer may be of a hot-melt type. Release paper may or may not be used. By thusly providing the adhesion layer or the tackiness layer, the thermoreversible recording label can be affixed to a whole surface or a part of a thick substrate such as a magnetic stripe-attached vinyl chloride card, which is difficult to coat with a recording layer. This makes it possible to improve the convenience of this medium, for example to display part of information stored in a magnetic recorder. The thermoreversible recording label provided with such an adhesion layer or tackiness layer can also be used on thick cards such as IC cards and optical cards.

In the thermoreversible recording medium, a colored layer may be provided between the support and the recording layer, for the purpose of improving visibility. The colored layer can be formed by applying a dispersion solution or a solution containing a colorant and a resin binder over a target surface and drying the dispersion solution or the solution; alternatively, the colored layer can be formed by simply bonding a colored sheet to the target surface.

The thermoreversible recording medium may be provided with a color printing layer. A colorant in the color printing layer is, for example, selected from dyes, pigments and the like contained in color inks used for conventional full-color printing. Examples of the resin binder include thermoplastic resins, thermosetting resins, ultraviolet curable resins and electron beam curable resins. The thickness of the color printing layer may be suitably selected according to the desired printed color density.

In the thermoreversible recording medium, an irreversible recording layer may be additionally used. In this case, the color-developing color tones of the recording layers may be identical or different. Also, a colored layer which has been printed in accordance with offset printing, gravure printing, etc. or which has been printed with a pictorial design or the like using an ink-jet printer, a thermal transfer printer, a sublimation printer, etc., for example, may be provided on the whole or a part of the same surface of the thermoreversible recording medium of the present invention as the surface where the recording layer is formed, or may be provided on a part of the opposite surface thereof. Further, an OP varnish layer composed mainly of a curable resin may be provided on a part or the whole surface of the colored layer. Examples of the pictorial design include letters/characters, patterns, diagrams, photographs, and information detected with an infrared ray. Also, any of the layers that are simply formed may be colored by addition of dye or pigment.

Further, the thermoreversible recording medium of the present invention may be provided with a hologram for security. Also, to give variety in design, it may also be provided with a design such as a portrait, a company emblem or a symbol by forming depressions and protrusions in relief or in intaglio.

The thermoreversible recording medium may be formed into a desired shape according to its use, for example into a card, a tag, a label, a sheet or a roll. The thermoreversible recording medium in the form of a card can be used for prepaid cards, discount cards, credit cards and the like. The thermoreversible recording medium in the form of a tag that is smaller in size than the card can be used for price tags and the like. The thermoreversible recording medium in the form of a tag that is larger in size than the card can be used for tickets, sheets of instruction for process control and shipping, and the like. The thermoreversible recording medium in the form of a label can be affixed; accordingly, it can be formed into a variety of sizes and, for example, used for process control and product control, being affixed to carts, receptacles, boxes, containers, etc. to be repeatedly used. The thermoreversible recording medium in the form of a sheet that is larger in size than the card offers a larger area for printing, and thus it can be used for general documents and sheets of instruction for process control, for example.

<Example of Combination of Thermoreversible Recording Member and RF-ID>

A thermoreversible recording member used in the present invention is superior in convenience because the recording layer capable of reversible display, and an information storage section are provided on the same card or tag (so as to form a single unit), and part of information stored in the information storage section is displayed on the recording layer, thereby making it is possible to confirm the information by simply looking at a card or a tag without needing a special device. Also, when information stored in the information storage section is rewritten, rewriting of information displayed by the thermoreversible recording member makes it possible to use the thermoreversible recording medium repeatedly as many times as desired.

The information storage section is not particularly limited and may be suitably selected in accordance with the intended use, and suitable examples thereof include a magnetic recording layer, a magnetic stripe, an IC memory, an optical memory and an RF-ID tag. In the case where the information storage section is used for process control, product control, etc., an RF-ID tag is particularly preferable. The RF-ID tag is composed of an IC chip, and an antenna connected to the IC chip.

The thermoreversible recording member includes the recording layer capable of reversible display, and the information storage section. Suitable examples of the information storage section include an RF-ID tag.

Figure 6:
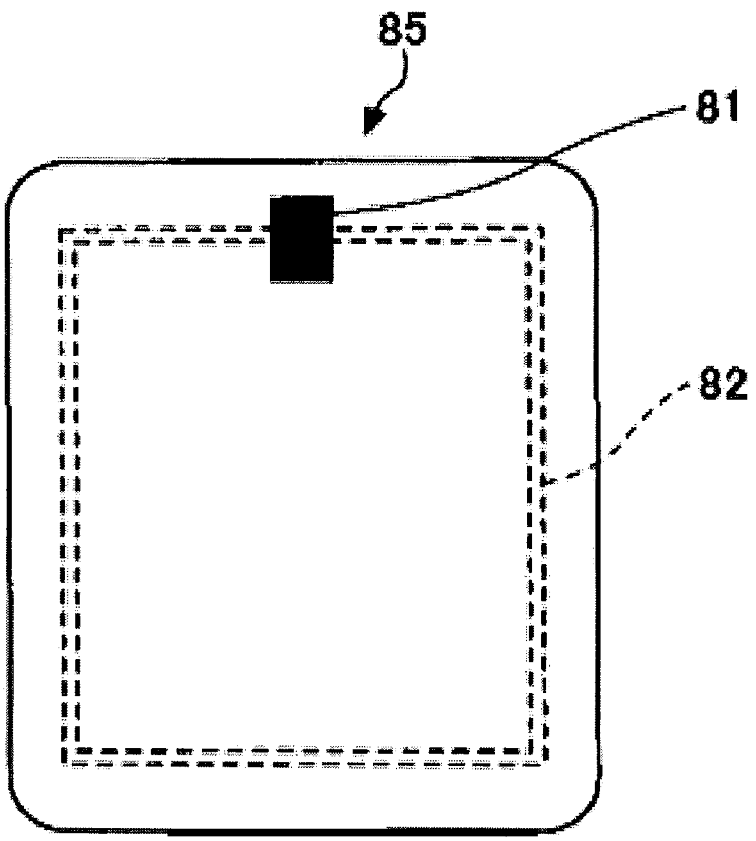
FIG. 6 is a schematic diagram showing an example of an RF-ID tag.

Here, FIG. 6 shows a schematic diagram of an example of an RF-ID tag 85. This RF-ID tag 85 is composed of an IC chip 81, and an antenna 82 connected to the IC chip 81. The IC chip 81 is divided into four sections, i.e. a storage section, a power adjusting section, a transmitting section and a receiving section, and communication is conducted as they perform their operations allotted. As for the communication, the RF-ID tag communicates with an antenna of a reader/writer by means of a radio wave so as to transfer data. Specifically, there are such two methods as follows: an electromagnetic induction method in which the antenna of the RF-ID tag receives a radio wave from the reader/writer, and electromotive force is generated by electromagnetic induction caused by resonance; and a radio wave method in which electromotive force is generated by a radiated electromagnetic field. In both methods, the IC chip inside the RF-ID tag is activated by an electromagnetic field from outside, information inside the chip is converted to a signal, then the signal is emitted from the RF-ID tag. This information is received by the antenna on the reader/writer side and recognized by a data processing unit, then data processing is carried out on the software side.

The RF-ID tag is formed into a label or a card and can be affixed to the thermoreversible recording medium. The RF-ID tag may be affixed to the recording layer surface or the back layer surface, desirably to the back surface layer. To stick the RF-ID tag and the thermoreversible recording medium together, a known adhesive or tackiness agent may be used.

Additionally, the thermoreversible recording medium and the RF-ID tag may be integrally formed by lamination or the like and then formed into a card or a tag.

(Image Processing Apparatus)

An image processing apparatus of the present invention is used in the image processing method of the present invention and includes at least a laser beam emitting unit, a beam scanning unit and a beam condensing unit, and an irradiation intensity distribution adjusting unit, and further includes a cooling unit and may include other members suitably selected in accordance with the necessity.

—Laser Beam Emitting Unit—

For the laser beam emitting unit, a semiconductor laser device is used.

The emission wavelength of a laser beam from the semiconductor laser is a wavelength of a beam which can be emitted from a semiconductor laser diode, and is a wavelength in the near infrared range, i.e. preferably 0.70 μm to 1.55 μm, and more preferably 0.8 μm to 1.0 μm.

When the laser beam having the above-mentioned wavelength is used, the thermoreversible recording medium absorbs the laser beam having the above-mentioned wavelength. Thus, it preferably has a layer for absorbing the semiconductor laser beam, such as a photothermal conversion layer or a recording layer in which photothermal conversion material is added.

—Beam Scanning Unit—

The beam scanning unit is disposed on a surface from which a laser beam is emitted in the laser beam emitting unit. Examples of the laser beam scanning unit include a laser beam scanning unit with the use of a galvano mirror, and a unit of moving a XY stage on which a thermoreversible recording medium is fixed. The unit of moving the XY stage is difficult to scan fine letters/characters at high speed. Therefore, the laser beam scanning unit with the use of a galvano mirror is preferably used as the scanning method.

—Beam Condensing Unit—

The beam condensing unit is a unit configured to condense a laser beam on the thermoreversible recording medium. When a galvano mirror is used, the distance from the beam condensing unit changes in accordance with the scanning position on the thermoreversible recording medium. Thus, a diameter of the condensed beam is changed by using a normal convex lens in combination with the galvano mirror. By contrast, as the beam condensing unit, an fθ lens is used combination with the galvano mirror, so that the diameter of the condensed beam can be kept constant regardless of the scanning position on the thermoreversible recording medium.

—Irradiation Intensity Distribution Adjusting Unit—

The irradiation intensity distribution adjusting unit has a function of changing the irradiation intensity distribution of the laser beam.

The arrangement of the irradiation intensity distribution adjusting unit is not particularly limited as long as it is disposed on a surface from which a laser beam is emitted in the laser beam emitting unit; the distance, etc. between the irradiation intensity distribution adjusting unit and the laser beam emitting unit may be suitably selected in accordance with the intended use, and the irradiation intensity distribution adjusting unit is preferably placed between the laser beam emitting unit and the after-mentioned galvano mirror, more preferably between the after-mentioned beam expander and the galvano mirror.

The irradiation intensity distribution adjusting unit has the function of changing the irradiation intensity distribution such that the ratio ($I_1/I_2$) of the irradiation intensity ($I_1$) of the applied laser beam in a central position of the applied laser beam to the irradiation intensity ($I_2$) of the applied laser beam on a plane corresponding to 95% of the total irradiation energy of the applied laser beam satisfies $1.20 \leqq I_1/I_2 \leqq 1.29$. Therefore, it is possible to reduce degradation of the thermoreversible recording medium caused by repeated image recording and erasure and to improve durability against repeated use, with the image contrast being maintained.

The irradiation intensity distribution adjusting unit is not particularly limited and may be suitably selected in accordance with the intended use. Suitable examples thereof include lenses, filters, masks, mirrors and fiber couplings, with lenses being preferable because of causing less energy loss, specifically kaleidoscopes, integrators, beam homogenizers, aspheric beam shapers (each of which is a combination of an intensity transformation lens and a phase correction lens), aspheric element lenses, and diffractive optical elements. When a filter, a mask or the like is used, the irradiation intensity can be adjusted by physically cutting a central part of the laser beam. Meanwhile, when a mirror is used, the irradiation intensity can be adjusted by using, for example, a deformable mirror that is linked to a computer and can be mechanically changed in shape, or a mirror in which the reflectance or the formation of depressions and protrusions on the surface varies from part to part.

Among these, aspheric element lenses and diffractive optical elements are particularly preferable, because of high degree of design flexibility in the intensity distribution adjusting element. A semiconductor laser having emission wavelengths of visible light to near infrared light is preferably used, because the irradiation intensity of the applied laser beam is easily adjusted by fiber coupling.

—Cooling Unit—

As the cooling unit configured to cool a semiconductor laser diode while measuring and controlling the temperature thereof, air-cooling, water-cooling or the like are used. Water-cooling is efficient, but it leads to an increase in the size of a device. Generally, air-cooling is used in a semiconductor laser having a low output of 50 W or less, and water-cooling is used in a semiconductor laser having an output of 50 W or more.

The semiconductor laser diode is necessary to be cooled, because the temperature thereof increases due to continuous beam emission, and diode itself may be broken. Moreover, an output of the laser beam and an emission wavelength may change in accordance with the temperature of the semiconductor laser diode. Thus, the semiconductor laser device can obtain stable irradiation output by providing the cooling unit so as to measure the temperature of the semiconductor laser diode and to keep the temperature constant.

The basic configuration of the image processing apparatus of the present invention is similar to that of a so-called laser maker, except that it has at least a laser beam emission unit, the beam scanning unit, the beam condensing unit and the irradiation intensity distribution adjusting unit. The image processing apparatus of the present invention includes at least an oscillator unit, a power control unit, and a program unit.

Figure 3:
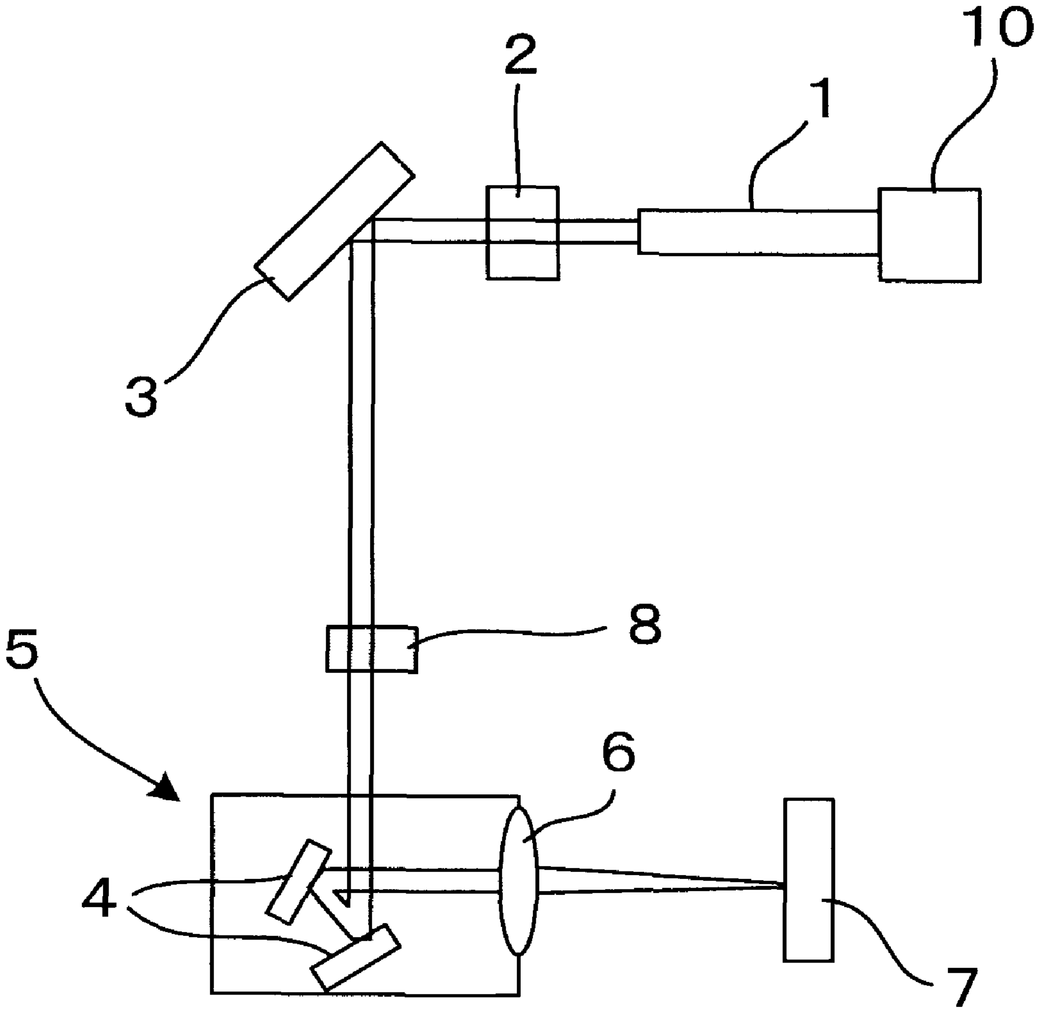
FIG. 3 is a diagram for explaining an example of an image processing apparatus of the present invention.

Here, in FIG. 3 an example of the image processing apparatus of the present invention, specifically a laser irradiation unit is illustrated.

Figure 7:
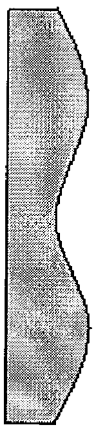
FIG. 7 is a diagram for explaining an example of an aspheric element lens used in the present invention.

The image processing apparatus shown in FIG. 3 uses a fiber coupled semiconductor laser (LIMO25F100-DL808-EX362, produced by LIMO Lissotschenko Mikrooptik GmbH) having an emission wavelength of 808 nm, a fiber diameter of 100 μm and a maximum output of 25 W, as a laser source. A laser beam is emitted from a fiber 1, and immediately after the laser emission, the laser beam is collimated by a collimator 2. In parallel optical paths, an aspheric element lens shown in FIG. 7 combined with the fiber is used as the irradiation intensity distribution adjusting unit, and a distance between an fθ lens 6 and a thermoreversible recording medium 7 is adjusted so as to change the ratio ($I_1/I_2$) of the irradiation intensity ($I_1$) of the applied laser beam in a central position of the applied laser beam to the irradiation intensity ($I_2$) of the applied laser beam on a plane corresponding to 95% of the total irradiation energy of the applied laser beam.

The oscillator unit consists of a semiconductor laser diode 10, the collimator 2, a scanning unit 5 and the like.

The scanning unit 5 is composed of two galvanometers containing mirrors 4 (not shown). By subjecting the laser beam, which has been output from the semiconductor laser diode 10, to high-speed rotary scanning, utilizing two mirrors 4 for the X axis and Y axis directions attached to the galvanometers, an image is recorded onto or erased from a thermoreversible recording medium 7.

In FIG. 3, 1, 3 and 8 respectively denote a fiber, mirror and lens.

The power control unit is composed of a power source for electric discharge; a power source for driving the galvanometer; a power source for cooling a Peltier device, etc.; a control unit for controlling the overall image processing apparatus; and the like.

The program unit consists of a computer for controlling, in which a software is installed, and is configured to input conditions such as the intensity of the laser beam and the speed of the laser scanning for recording or erasure of an image, and to produce and edit letters/characters, etc. to be recorded in accordance with a command from the software.

The laser irradiation unit, that is, a head part for an image recording/erasure is mounted in the image processing apparatus. In addition, the image processing apparatus includes a part of conveying the thermoreversible recording medium and a control part thereof, a monitor and the like.

The image processing method and the image processing apparatus of the present invention are capable of repeatedly recording and erasing a high-contrast image at high speed and in a noncontact manner onto and from a thermoreversible recording medium, for example a label affixed to cardboard or to a receptacle such as a plastic container, and also capable of reducing degradation of the thermoreversible recording medium caused by repeated use. Hence, they can be particularly suitably used in product distribution and delivery systems. In this case, for instance, it is possible to record and erase an image onto and from the label while moving the cardboard or the plastic container placed on a conveyor belt, and to shorten the shipping time because the line does not need stopping. Also, the cardboard or the plastic container to which the label is affixed can be reused as it is, without the need to detach the label, and subjected to image erasure and recording again.

According to the present invention, it is possible to solve conventional problems and to provide an image processing method and an image processing apparatus, wherein a thermoreversible recording medium can be uniformly heated, excessive energy is not applied to the thermoreversible recording medium, degradation of the thermoreversible recording medium can be reduced when recording and erasure are repeatedly carried out, durability against repeated use can be improved, and written lines can be changed in width by adjusting the irradiation power, without needing to change the irradiation distance.

EXAMPLES

Hereinafter, Examples of the present invention will be explained. However, it should be noted that the present invention is not confined to these Examples in any way.

Production Example 1

Production of Thermoreversible Recording Medium

A thermoreversible recording medium in which color tone changed reversibly (transparent state—color-developed state) depending upon temperature was produced in the following manner.

—Support—

As a support, a white turbid polyester film (TETORON FILM U2L98 W, produced by Teijin DuPont Films Japan Limited) having a thickness of 125 μm was used.

—Under Layer—

Thirty (30) parts by mass of a styrene-butadiene copolymer (PA-9159, produced by Nippon A&L Inc.), 12 parts by mass of a polyvinyl alcohol resin (POVAL PVA103, produced by Kuraray Co., Ltd.), 20 parts by mass of hollow particles (MICROSPHERE R-300, produced by Matsumoto Yushi-Seiyaku Co., Ltd.) and 40 parts by mass of water were mixed, and stirred for approximately 1 hr so as to be uniformly mixed, thereby preparing an under layer coating solution.

Next, an under layer having a thickness of 20 μm was formed by applying the obtained under layer coating solution onto the support with the use of a wire bar, then heating and drying the under layer coating solution at 80° C. for 2 min.

—Thermoreversible Recording Layer (Recording Layer)—

Using a ball mill, 5 parts by mass of the reversible developer represented by Structural Formula (1) below, 0.5 parts by mass each of the two types of color erasure accelerators represented by Structural Formulae (2) and (3) below, 10 parts by mass of a 50% acrylpolyol solution (hydroxyl value=200 mgKOH/g), and 80 parts by mass of methyl ethyl ketone were pulverized and dispersed such that the average particle diameter became approximately 1 μm.

Structural Formula (1)

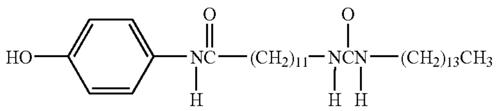

Reversible Developer

Structural Formula (2)

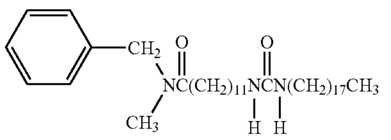

Color Erasure Accelerator

Structural Formula (3)

$C_{17}H_{35}CONHC_{18}H_{35}$

Next, into the dispersion solution in which the reversible developer had been pulverized and dispersed, 1 part by mass of 2-anilino-3-methyl-6-dibutylaminofluoran as a leuco dye, 0.2 parts by mass of the phenolic antioxidant (IRGANOX 565, produced by Ciba Specialty Chemicals plc.) represented by Structural Formula (4) below, and 5 parts by mass of an isocyanate (CORONATE HL, produced by Nippon Polyurethane Industry Co., Ltd.) were added. In the obtained solution, 0.02% by mass of a photothermal conversion material (IR14, a phthalocyanine compound produced by NIPPON SHOKUBAI CO., LTD.) was added, and then sufficiently stirred to prepare a recording layer coating solution.

Structural Formula (4)

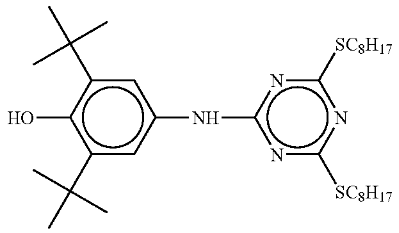

Subsequently, the prepared recording layer coating solution was applied, using a wire bar, onto the support over which the under layer had already been formed, and the recording layer coating solution was dried at 100° C. for 2 min, then cured at 60° C. for 24 hr so as to form a recording layer having a thickness of 11 μm.

—Intermediate Layer—

Three (3) parts by mass of a 50% acrylpolyol resin solution (LR327, produced by Mitsubishi Rayon Co., Ltd.), 7 parts by mass of a 30% zinc oxide fine particle dispersion solution (ZS303, produced by Sumitomo Cement Co., Ltd.), 1.5 parts by mass of an isocyanate (CORONATE HL, produced by Nippon Polyurethane Industry Co., Ltd.), and 7 parts by mass of methyl ethyl ketone were mixed, and sufficiently stirred to prepare an intermediate layer coating solution.

Next, the intermediate layer coating solution was applied, using a wire bar, onto the support over which the under layer and the recording layer had already been formed, and the intermediate layer coating solution was heated and dried at 90° C. for 1 min, and then heated at 60° C. for 2 hr so as to form an intermediate layer having a thickness of 2 μm.

—Protective Layer—

Three (3) parts by mass of pentaerythritol hexaacrylate (KAYARAD DPHA, produced by Nippon Kayaku Co., Ltd.), 3 parts by mass of an urethane acrylate oligomer (ART RESIN UN-3320HA, produced by Negami Chemical Industrial Co., Ltd.), 3 parts by mass of an acrylic acid ester of dipentaerythritol caprolactone (KAYARAD DPCA-120, produced by Nippon Kayaku Co., Ltd.), 1 part by mass of a silica (P-526, produced by Mizusawa Industrial Chemicals, Ltd.), 0.5 parts by mass of a photopolymerization initiator (IRGACURE 184, produced by Nihon Ciba-Geigy K.K.), and 11 parts by mass of isopropyl alcohol were mixed, and sufficiently stirred and dispersed by the use of a ball mill, such that the average particle diameter became approximately 3 μm, thereby preparing a protective layer coating solution.

Next, the protective layer coating solution was applied, using a wire bar, onto the support over which the under layer, the recording layer and the intermediate layer had already been formed, and the protective layer coating solution was heated and dried at 90° C. for 1 min, then cross-linked by means of an ultraviolet lamp of 80 W/cm, so as to form a protective layer having a thickness of 4 μm.

—Back Layer—

Pentaerythritol hexaacrylate (KAYARAD DPHA, produced by Nippon Kayaku Co., Ltd.)(7.5 parts by mass), 2.5 parts by mass of an urethane acrylate oligomer (ART RESIN UN-3320HA, produced by Negami Chemical Industrial Co., Ltd.), 2.5 parts by mass of a needle-like conductive titanium oxide (FT-3000, major axis=5.15 μm, minor axis=0.27 μm, structure: titanium oxide coated with antimony-doped tin oxide; produced by Ishihara Sangyo Kaisha, Ltd.), 0.5 parts by mass of a photopolymerization initiator (IRGACURE 184, produced by Nihon Ciba-Geigy K.K.) and 13 parts by mass of isopropyl alcohol were mixed, and sufficiently stirred by the use of a ball mill, so as to prepare a back layer coating solution.

Next, the back layer coating solution was applied, using a wire bar, onto the surface of the support opposite to the surface thereof over which the recording layer, the intermediate layer and the protective layer had already been formed, and the back layer coating solution was heated and dried at 90° C. for 1 min, then cross-linked by means of an ultraviolet lamp of 80 W/cm, so as to form a back layer having a thickness of 4 μm. Thus, a thermoreversible recording medium of Production Example 1 was produced.

Production Example 2

Production of Thermoreversible Recording Medium

A thermoreversible recording medium in which transparency changed reversibly (transparent state—white turbid state) depending upon temperature was produced in the following manner.

—Support—

As a support, a transparent PET film (LUMIRROR 175-T12, produced by Toray Industries, Inc.) having a thickness of 175 μm was used.

—Thermoreversible Recording Layer (Recording Layer)—

Into a resin-containing solution in which 26 parts by mass of a vinyl chloride copolymer (M 110, produced by ZEON CORPORATION) was dissolved in 210 parts by mass of methyl ethyl ketone, 3 parts by mass of the low-molecular organic material represented by Structural Formula (5) below and 7 parts by mass of docosyl behenate were added, and then, in a glass jar, ceramic beads having a diameter of 2 mm were set, and the mixture was dispersed for 48 hr using PAINT SHAKER (produced by Asada Iron Works. Co., Ltd), so as to prepare a uniformly dispersed solution.

Structural Formula (5)

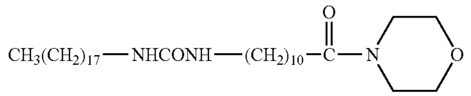

Next, in the obtained dispersion solution, 4 parts by mass of an isocyanate compound (CORONATE 2298-90T, produced by Nippon Polyurethane Industry Co., Ltd.) was added. In this solution, 0.02% by mass of a photothermal conversion material (IR14, a phthalocyanine compound produced by NIPPON SHOKUBAI CO., LTD.) was added, and then sufficiently stirred to prepare a recording layer coating solution.

Subsequently, the obtained recording layer solution was applied on the support, then heated and dried; thereafter, the recording layer solution was stored at 65° C. for 24 hr; so as to cross-link the resin. Thus, a thermosensitive recording layer having a thickness of 10 μm was provided over the support.

—Protective Layer—

A solution containing 10 parts by mass of a 75% butyl acetate solution of urethane acrylate ultraviolet curable resin (UNIDIC C7-157, produced by Dainippon Ink and Chemicals, Incorporated) and 10 parts by mass of isopropyl alcohol was applied, using a wire bar, onto the thermosensitive recording layer, then heated and dried; thereafter, the solution was cured by ultraviolet irradiation with a high-pressure mercury-vapor lamp of 80 W/cm, so as to form a protective layer having a thickness of 3 μm. Thus, a thermoreversible recording medium of Production Example 2 was produced.

<Measurement of Laser Beam Intensity Distribution>

The intensity distribution of a laser beam was measured in accordance with the following procedure.

First of all, a high-power laser beam analyzer (SCORPION SCOR-20SCM produced by Point Grey Research Inc.) was set such that the irradiation distance became the same as that at the time of recording onto a thermoreversible recording medium, then darkening was conducted using a beam splitter (BEAMSTAR-FX-BEAM SPLITTER produced by OPHIR, in which a transparent mirror and a filter were combined such that the laser output became $3\times10^{-6}$, and the laser beam intensity was measured with the high-power laser beam analyzer. Next, the obtained laser beam intensity was formed into a three-dimensional graph, and the intensity distribution of the laser beam was thus obtained.

<Measurement of Reflection Density>

As to the measurement of the reflection density, a gray scale (produced by Kodak Japan Ltd.) was scanned by a scanner (CANOSCAN 4400, produced by Canon Inc.), the obtained digital gray-scale values were correlated with density values measured by a reflection densitometer (RD-914, produced by Macbeth Co.), and the digital gray-scale values, obtained by scanning a recorded image and an erased portion with the scanner, were converted to the density values, which were defined as the reflection density values.

In the present invention, erasure of an image was enabled when the density of the erased portion was 1.5 or greater in the case of a thermoreversible recording medium in which the thermoreversible recording layer contained a resin and a low-molecular organic material, and when the density of the erased portion was 0.15 or less in the case of a thermoreversible recording medium in which the thermoreversible recording layer contained a leuco dye and a reversible developer. Additionally, as to the thermoreversible recording medium in which the thermoreversible recording layer contained a resin and a low-molecular organic material, the density was measured, with a sheet of black paper (O.D. value=1.7) being laid on the back surface thereof.

Example 1

A semiconductor laser device equipped with a fiber-coupled semiconductor laser having an output of 25 W and an emission wavelength of 808 nm, in which the fiber was used as the irradiation intensity distribution adjusting unit, was used as a light source of a semiconductor laser as shown in FIG. 3, and an image was recorded onto the thermoreversible recording medium of Production Example 1 by applying a laser beam, as the laser output, the irradiation distance, the focal distance of the fθ lens, the spot diameter and the scanning speed were adjusted to 9.0 W, 155 mm, 150 mm, 0.72 mm and 1,000 mm/s, respectively.

On this occasion, the irradiation intensity ($I_1$) of the applied laser beam in a central position of the applied laser beam was 1.29 times the irradiation intensity ($I_2$) of the applied laser beam on a plane corresponding to 95% of the total irradiation energy of the applied laser beam. The temperature of the semiconductor laser was controlled to maintain at 25° C. by air-cooling.

As for measurement of the line width on this occasion, the line width was defined as the width of a line when the density values were 0.5 or greater in the case where a gray scale (produced by Kodak Japan Ltd.) was scanned by a scanner (CANOSCAN 4400, produced by Canon Inc.), the obtained digital gray-scale values were correlated with density values measured by a reflection densitometer (RD-914, produced by Macbeth Co.), and the digital gray-scale values, obtained by scanning a recorded image with the scanner, were converted to the density values; and the line width was calculated from a predetermined number of pixels (1,200 dpi) for the digital gray-scale values. Thus, the line width was 0.33 mm.

Next, the laser output, the irradiation distance, the spot diameter and the scanning speed were adjusted to 20 W, 195 mm, 3 mm and 1,000 mm/s, respectively, and a laser beam was linearly scanned across the recorded image at intervals of 0.59 mm so as to erase the image. The density of the erased portion at that time was 0.15.

When image recording and image erasure were repeated under the above-mentioned conditions, and the density of the erased portion was measured once every 50 times, it turned out that image erasure was possible with a density of 0.17 at the time when repeated 250 times, and that an unerased portion was left with a density of 0.20 at the time when repeated 300 times. When the thermoreversible recording medium of Production Example 1 is used in a product distribution and delivery system such as home delivery, being affixed to a plastic container, the plastic container is used with a one-week cycle in many cases, and so image recording and image erasure are carried out once a week; meanwhile, the plastic container is discarded in roughly three years in many cases because of damage, dirt, etc.; thus, the thermoreversible recording medium can keep being used during the lifetime of the plastic container, without the need to replace it, as long as it allows image recording and image erasure to be repeated 250 times.

Subsequently, when an image was recorded under the above-mentioned recording conditions except that the laser output was reduced, the minimum width of the line free from blurring was 0.20 mm. The results are shown in Table 1.

Example 2

The same semiconductor laser device as the one in Example 1 was used, and an image was recorded onto the thermoreversible recording medium of Production Example 1 by applying a laser beam, as the laser output, the irradiation distance, the spot diameter and the scanning speed were adjusted to 9.2 W, 152 mm, 0.73 mm and 1,000 mm/s, respectively. On this occasion, the irradiation intensity ($I_1$) of the applied laser beam in a central position of the applied laser beam was 1.25 times the irradiation intensity ($I_2$) of the applied laser beam on a plane corresponding to 95% of the total irradiation energy of the applied laser beam. The line width, which was measured similarly to that in Example 1, was 0.33 mm.

Next, the laser output, the irradiation distance, the spot diameter and the scanning speed were adjusted to 20 W, 195 mm, 3 mm and 1000 mm/s, respectively, and a laser beam was linearly scanned across the recorded image at intervals of 0.59 mm so as to erase the image. The density of the erased portion at that time was 0.15.

When image recording and image erasure were repeated under the above-mentioned conditions, and the density of the erased portion was measured once every 50 times, it turned out that image erasure was possible with a density of 0.17 at the time when repeated 400 times, and that an unerased portion was left with a density of 0.20 at the time when repeated 450 times.

Subsequently, when an image was recorded under the above-mentioned recording conditions except that the laser output was reduced, the minimum width of the line free from blurring was 0.21 mm. The results are shown in Table 1.

Example 3

The same semiconductor laser device as the one in Example 1 was used, and an image was recorded onto the thermoreversible recording medium of Production Example 1 by applying a laser beam, as the laser output, the irradiation distance, the spot diameter and the scanning speed were adjusted to 9.3 W, 150 mm, 0.75 mm and 1,000 mm/s, respectively. The irradiation intensity ($I_1$) of the applied laser beam in a central position of the applied laser beam was 1.20 times the irradiation intensity ($I_2$) of the applied laser beam on a plane corresponding to 95% of the total irradiation energy of the applied laser beam. The line width, which was measured similarly to that in Example 1, was 0.33 mm.

Next, the laser output, the irradiation distance, the spot diameter and the scanning speed were adjusted to 20 W, 195 mm, 3 mm and 1,000 mm/s, respectively, and a laser beam was linearly scanned across the recorded image at intervals of 0.59 mm so as to erase the image. The density of the erased portion at that time was 0.15.

When image recording and image erasure were repeated under the above-mentioned conditions, and the density of the erased portion was measured once every 50 times, it turned out that image erasure was possible with a density of 0.17 at the time when repeated 600 times, and that an unerased portion was left with a density of 0.20 at the time when repeated 650 times.

Subsequently, when an image was recorded under the above-mentioned recording conditions except that the laser output was reduced, the minimum width of the line free from blurring was 0.25 mm. The results are shown in Table 1.

Example 4

Image recording and image erasure were carried out similarly to those in Example 1, except that the thermoreversible recording medium of Production Example 1 was changed to the thermoreversible recording medium of Production Example 2, the laser output at the time of image recording was changed to 6.2 W, and the laser output at the time of image erasure was changed to 14 W. The irradiation intensity ($I_1$) of the applied laser beam in a central position of the applied laser beam was 1.29 times the irradiation intensity ($I_2$) of the applied laser beam on a plane corresponding to 95% of the total irradiation energy of the applied laser beam. As for measurement of the line width on this occasion, the line width was defined as the width of a line when the density values were 1.15 or less in the case where a gray scale (produced by Kodak Japan Ltd.) was scanned by a scanner (CANOSCAN 4400, produced by Canon Inc.), the obtained digital gray-scale values were correlated with density values measured by a reflection densitometer (RD-914, produced by Macbeth Co.), and the digital gray-scale values, obtained by scanning a recorded image with the scanner, were converted to the density values; and the line width was calculated from a predetermined number of pixels (1,200 dpi) for the digital gray-scale values. Thus, the line width was 0.33 mm.

When image recording and image erasure were repeated under the above-mentioned conditions, and the density of the erased portion was measured once every 50 times, it turned out that image erasure was possible with a density of 1.65 at the time when repeated 400 times, and that an unerased portion was left with a density of 1.51 at the time when repeated 450 times.

Subsequently, when an image was recorded under the above-mentioned recording conditions except that the laser output was reduced, the minimum width of the line free from blurring was 0.21 mm. The results are shown in Table 1.

Example 5

Image recording and image erasure were carried out similarly to those in Example 2, except that the thermoreversible recording medium of Production Example 1 was changed to the thermoreversible recording medium of Production Example 2, the laser output at the time of image recording was changed to 6.4 W, and the laser output at the time of image erasure was changed to 14 W. The irradiation intensity ($I_1$) of the applied laser beam in a central position of the applied laser beam was 1.25 times the irradiation intensity ($I_2$) of the applied laser beam on a plane corresponding to 95% of the total irradiation energy of the applied laser beam. The line width, which was measured similarly to that in Example 4, was 0.33 mm.

When image recording and image erasure were repeated under the above-mentioned conditions, and the density of the erased portion was measured once every 50 times, it turned out that image erasure was possible with a density of 1.65 at the time when repeated 600 times, and that an unerased portion was left with a density of 1.52 at the time when repeated 650 times.

Subsequently, when an image was recorded under the above-mentioned recording conditions except that the laser output was reduced, the minimum width of the line free from blurring was 0.22 mm. The results are shown in Table 1.

Example 6

Image recording and image erasure were carried out similarly to those in Example 3, except that the thermoreversible recording medium of Production Example 1 was changed to the thermoreversible recording medium of Production Example 2, the laser output at the time of image recording was changed to 6.5 W, and the laser output at the time of image erasure was changed to 14 W. The irradiation intensity ($I_1$) of the applied laser beam in a central position of the applied laser beam was 1.20 times the irradiation intensity ($I_2$) of the applied laser beam on a plane corresponding to 95% of the total irradiation energy of the applied laser beam. The line width, which was measured similarly to that in Example 4, was 0.33 mm.

When image recording and image erasure were repeated under the above-mentioned conditions, and the density of the erased portion was measured once every 50 times, it turned out that image erasure was possible with a density of 1.64 at the time when repeated 800 times, and that an unerased portion was left with a density of 1.50 at the time when repeated 850 times.

Subsequently, when an image was recorded under the above-mentioned recording conditions except that the laser output was reduced, the minimum width of the line free from blurring was 0.25 mm. The results are shown in Table 1.

Example 7

A semiconductor laser device equipped with a fiber coupled semiconductor laser having an output of 25 W and an emission wavelength of 808 nm, in which an aspheric element lens was incorporated in the optical path, was used as a light source of a semiconductor laser as shown in FIG. 3, and an image was recorded onto the thermoreversible recording medium of Production Example 1 by applying a laser beam, as the laser output, the irradiation distance, the focal distance of the fθ lens, the spot diameter and the scanning speed were adjusted to 13.0 W, 155 mm, 150 mm, 0.92 mm and 1,000 mm/s, respectively. On this occasion, the irradiation intensity ($I_1$) of the applied laser beam in a central position of the applied laser beam was 1.25 times the irradiation intensity ($I_2$) of the applied laser beam on a plane corresponding to 95% of the total irradiation energy of the applied laser beam.

As for measurement of the line width on this occasion, the line width was defined as the width of a line when the density values were 0.5 or more in the case where a gray scale (produced by Kodak Japan Ltd.) was scanned by a scanner (CANOSCAN 4400, produced by Canon Inc.), the obtained digital gray-scale values were correlated with density values measured by a reflection densitometer (RD-914, produced by Macbeth Co.), and the digital gray-scale values, obtained by scanning a recorded image with the scanner, were converted to the density values; and the line width was calculated from a predetermined number of pixels (1,200 dpi) for the digital gray-scale values. Thus, the line width was 0.45 mm.

Next, the laser output, the irradiation distance, the spot diameter and the scanning speed were adjusted to 20 W, 195 mm, 3 mm and 1,000 mm/s, respectively, and a laser beam was linearly scanned across the recorded image at intervals of 0.59 mm so as to erase the image. The density of the erased portion at that time was 0.15.

When image recording and image erasure were repeated under the above-mentioned conditions, and the density of the erased portion was measured once every 50 times, it turned out that image erasure was possible with a density of 0.17 at the time when repeated 700 times, and that an unerased portion was left with a density of 0.20 at the time when repeated 750 times.

Subsequently, when an image was recorded under the above-mentioned recording conditions except that the laser output was reduced, the minimum width of the line free from blurring was 0.29 mm. The results are shown in Table 1.

Example 8

A semiconductor laser device equipped with a fiber coupled semiconductor laser having an output of 25 W and an emission wavelength of 808 nm, in which an aspheric element lens was incorporated in the optical path, was used as a light source of a semiconductor laser as shown in FIG. 3, and an image was recorded onto the thermoreversible recording medium of Production Example 1 by applying a laser beam, as the laser output, the irradiation distance, the focal distance of the fθ lens, the spot diameter and the scanning speed were adjusted to 14.0 W, 154 mm, 150 mm, 0.91 mm and 1,000 mm/s, respectively. On this occasion, the irradiation intensity ($I_1$) of the applied laser beam in a central position of the applied laser beam was 1.24 times the irradiation intensity ($I_2$) of the applied laser beam on a plane corresponding to 95% of the total irradiation energy of the applied laser beam. The line width was 0.44 mm.

Next, the laser output, the irradiation distance, the spot diameter and the scanning speed were adjusted to 20 W, 195 mm, 3 mm and 1,000 mm/s, respectively, and a laser beam was linearly scanned across the recorded image at intervals of 0.59 mm so as to erase the image. The density of the erased portion at that time was 0.15.

When image recording and image erasure were repeated under the above-mentioned conditions, and the density of the erased portion was measured once every 50 times, it turned out that image erasure was possible with a density of 0.17 at the time when repeated 700 times, and that an unerased portion was left with a density of 0.20 at the time when repeated 750 times.

Subsequently, when an image was recorded under the above-mentioned recording conditions except that the laser output was reduced, the minimum width of the line free from blurring was 0.29 mm. The results are shown in Table 1.

Example 9

When recording and erasure were repeatedly carried out under the conditions of Example 1 without cooling the light source of the semiconductor laser, the temperature of the semiconductor laser was raised to 40° C. and blurring in a line occurred.

Example 10

The following image forming step and image erasing step were carried out on the thermoreversible recording medium of Production Example 1.

<Image Forming Step>

A 140 W fiber-coupled high-output semiconductor laser device equipped with a light collecting optical system f100 (NBITS140mkII, center wavelength: 808 nm, core diameter of an optical fiber: 600 μm, NA: 0.22, produced by Jenoptik) was used as a laser, and the laser output, the irradiation distance and the spot diameter were adjusted to 12 W, 91.7 mm and approximately 0.6 mm, respectively. A linear image was formed on the thermoreversible recording medium by applying a laser beam at a feed speed of XY stage of 1,200 mm/s. On this occasion, the irradiation intensity ($I_1$) of the applied laser beam in a central position of the applied laser beam was 1.25 times the irradiation intensity ($I_2$) of the applied laser beam on a plane corresponding to 95% of the total irradiation energy of the applied laser beam.

<Image Erasing Step>

Next, the image was erased by heating the image at 140° C. for 1 sec under a pressure of 1 kgf/cm$^2$, using a thermal inclination tester (TYPE HG-100, produced by Toyo Seiki Co., Ltd.).

When image recording and image erasure were repeated under the above-mentioned conditions, and the density of the erased portion was measured once every 10 times, it turned out that image erasure was possible with a density of 0.17 at the time when repeated 90 times, and that an unerased portion was left with a density of 0.20 at the time when repeated 100 times.

Subsequently, when an image was recorded under the above-mentioned recording conditions except that the laser output was reduced, the minimum width of the line free from blurring was 0.25 mm. The results are shown in Table 1.

Example 11

The same semiconductor laser device as the one in Example 1 was used, the thermoreversible recording medium of Production Example 1 was affixed to a plastic box, and all the letters ("A" to "Z") in the English alphabet were recorded, under the recording conditions of Example 1, onto the thermoreversible recording medium while being moved at a conveyance speed of 3 m/min on a conveyor belt.

Next, all the letters ("A" to "Z") in the English alphabet were erased, under the erasure conditions of Example 1, from the thermoreversible recording medium affixed to the plastic box, while being moved at a conveyance speed of 3 m/min on the conveyor belt.

Comparative Example 1

The same semiconductor laser device as the one in Example 1 was used, and an image was recorded onto the thermoreversible recording medium of Production Example 1 by applying a laser beam, as the laser output, the irradiation distance, the spot diameter and the scanning speed were adjusted to 9.4 W, 160 mm, 0.75 mm and 1,000 mm/s, respectively. The irradiation intensity (II) of the applied laser beam in a central position of the applied laser beam was 1.43 times the irradiation intensity (12) of the applied laser beam on a plane corresponding to 95% of the total irradiation energy of the applied laser beam. The irradiation intensity distribution of the applied laser beam is substantially the same as a Gaussian distribution. The line width, which was measured similarly to that in Example 1, was 0.33 mm.

Next, the laser output, the irradiation distance, the spot diameter and the scanning speed were adjusted to 20 W, 195 mm, 3 mm and 1,000 mm/s, respectively, and a laser beam was linearly scanned across the recorded image at intervals of 0.59 mm so as to erase the image. The density of the erased portion at that time was 0.15.

When image recording and image erasure were repeated under the above-mentioned conditions, and the density of the erased portion was measured once every 10 times, it turned out that image erasure was possible with a density of 0.17 at the time when repeated 40 times, and that an unerased portion was left with a density of 0.24 at the time when repeated 50 times.

Subsequently, when an image was recorded under the above-mentioned recording conditions except that the laser output was reduced, the minimum width of the line free from blurring was 0.17 mm. The results are shown in Table 1.

Comparative Example 2

The same semiconductor laser device as the one in Example 1 was used, and an image was recorded onto the thermoreversible recording medium of Production Example 1 by applying a laser beam, as the laser output, the irradiation distance, the spot diameter and the scanning speed were adjusted to 9.3 W, 156 mm, 0.73 mm and 1,000 mm/s, respectively. The irradiation intensity ($I_1$) of the applied laser beam in a central position of the applied laser beam was 1.30 times the irradiation intensity ($I_2$) of the applied laser beam on a plane corresponding to 95% of the total irradiation energy of the applied laser beam. The line width, which was measured similarly to that in Example 1, was 0.33 mm.

Next, the laser output, the irradiation distance, the spot diameter and the scanning speed were adjusted to 20 W, 195 mm, 3 mm and 1,000 mm/s, respectively, and a laser beam was linearly scanned across the recorded image at intervals of 0.59 mm so as to erase the image. The density of the erased portion at that time was 0.15.

When image recording and image erasure were repeated under the above-mentioned conditions, and the density of the erased portion was measured once every 10 times, it turned out that image erasure was possible with a density of 0.17 at the time when repeated 100 times, and that an unerased portion was left with a density of 0.20 at the time when repeated 110 times.

Subsequently, when an image was recorded under the above-mentioned recording conditions except that the laser output was reduced, the minimum width of the line free from blurring was 0.19 mm. The results are shown in Table 1.

Comparative Example 3

The same semiconductor laser device as the one in Example 1 was used, and an image was recorded onto the thermoreversible recording medium of Production Example 1 by applying a laser beam, as the laser output, the irradiation distance, the spot diameter and the scanning speed were adjusted to 9.1 W, 148 mm, 0.73 mm and 1,000 mm/s, respectively. The irradiation intensity ($I_1$) of the applied laser beam in a central position of the applied laser beam was 1.19 times the irradiation intensity ($I_2$) of the applied laser beam on a plane corresponding to 95% of the total irradiation energy of the applied laser beam. The line width, which was measured similarly to that in Example 1, was 0.33 mm.

Next, the laser output, the irradiation distance, the spot diameter and the scanning speed were adjusted to 20 W, 195 mm, 3 mm and 1,000 mm/s, respectively, and a laser beam was linearly scanned across the recorded image at intervals of 0.59 mm so as to erase the image. The density of the erased portion at that time was 0.15.

When image recording and image erasure were repeated under the above-mentioned conditions, and the density of the erased portion was measured once every 50 times, it turned out that image erasure was possible with a density of 0.17 at the time when repeated 800 times, and that an unerased portion was left with a density of 0.20 at the time when repeated 850 times.

Subsequently, when an image was recorded under the above-mentioned recording conditions except that the laser output was reduced, the minimum width of the line free from blurring was 0.30 mm. The results are shown in Table 1.

Comparative Example 4

Image recording and image erasure were carried out similarly to those in Comparative Example 1, except that the thermoreversible recording medium of Production Example 1 was changed to the thermoreversible recording medium of Production Example 2, the laser output at the time of image recording was changed to 6.6 W. The irradiation intensity ($I_1$) of the applied laser beam in a central position of the applied laser beam was 1.43 times the irradiation intensity ($I_2$) of the applied laser beam on a plane corresponding to 95% of the total irradiation energy of the applied laser beam. The line width, which was measured similarly to that in Example 4, was 0.33 mm.

When image recording and image erasure were repeated under the above-mentioned conditions, and the density of the erased portion was measured once every 10 times, it turned out that image erasure was possible with a density of 1.64 at the time when repeated 60 times, and that an unerased portion was left with a density of 1.48 at the time when repeated 70 times.

Subsequently, when an image was recorded under the above-mentioned recording conditions except that the laser output was reduced, the minimum width of the line free from blurring was 0.18 mm. The results are shown in Table 1.

Comparative Example 5

Image recording and image erasure were carried out similarly to those in Comparative Example 2, except that the thermoreversible recording medium of Production Example 1 was changed to the thermoreversible recording medium of Production Example 2, the laser output at the time of image recording was changed to 6.5 W. The irradiation intensity ($I_1$) of the applied laser beam in a central position of the applied laser beam was 1.30 times the irradiation intensity ($I_2$) of the applied laser beam on a plane corresponding to 95% of the total irradiation energy of the applied laser beam. The line width, which was measured similarly to that in Example 4, was 0.33 mm.

When image recording and image erasure were repeated under the above-mentioned conditions, and the density of the erased portion was measured once every 10 times, it turned out that image erasure was possible with a density of 1.64 at the time when repeated 150 times, and that an unerased portion was left with a density of 1.49 at the time when repeated 160 times.

Subsequently, when an image was recorded under the above-mentioned recording conditions except that the laser output was reduced, the minimum width of the line free from blurring was 0.19 mm. The results are shown in Table 1.

Comparative Example 6

Image recording and image erasure were carried out similarly to those in Comparative Example 3, except that the thermoreversible recording medium of Production Example 1 was changed to the thermoreversible recording medium of Production Example 2, the laser output at the time of image recording was changed to 6.2 W. The irradiation intensity ($I_1$) of the applied laser beam in a central position of the applied laser beam was 1.19 times the irradiation intensity ($I_2$) of the applied laser beam on a plane corresponding to 95% of the total irradiation energy of the applied laser beam. The line width, which was measured similarly to that in Example 4, was 0.33 mm.

When image recording and image erasure were repeated under the above-mentioned conditions, and the density of the erased portion was measured once every 100 times, it turned out that image erasure was possible with a density of 1.63 at the time when repeated 1,300 times, and that an unerased portion was left with a density of 1.57 at the time when repeated 1,400 times.

Subsequently, when an image was recorded under the above-mentioned recording conditions except that the laser output was reduced, the minimum width of the line free from blurring was 0.31 mm. The results are shown in Table 1.

Comparative Example 7

The same semiconductor laser device as the one in Example 1 was used, the thermoreversible recording medium of Production Example 1 was affixed to a plastic box, and all the letters (“A” to “Z”) in the English alphabet were recorded, under the recording conditions of Comparative Example 1, onto the thermoreversible recording medium while being moved at a conveyance speed of 5 m/min on a conveyor belt.

Next, all the letters (“A” to “Z”) in the English alphabet were erased, under the erasure conditions of Comparative Example 1, from the thermoreversible recording medium affixed to the plastic box, while being moved at a conveyance speed of 5 m/min on the conveyor belt.

When image recording and image erasure were repeated under the above-mentioned conditions, an unerased portion was left at the time when repeated 50 times as in Comparative Example 1.

Comparative Example 8

The following image forming step and image erasing step were carried out on the thermoreversible recording medium of Production Example 1.

<Image Forming Step>

A 140 W fiber-coupled high-output semiconductor laser device equipped with a light collecting optical system f100 (NBT-S140mkII, center wavelength: 808 nm, core diameter of an optical fiber: 600 μm, NA: 0.22, produced by Jenoptik) was used as a laser, and the laser output, the irradiation distance and the spot diameter were adjusted to 12 W, 92.0 mm and approximately 0.6 mm, respectively. A linear image was formed on the thermoreversible recording medium by applying a laser beam at a feed speed of XY stage of 1,200 mm/s. On this occasion, the irradiation intensity ($I_1$) of the applied laser beam in a central position of the applied laser beam was 1.30 times the irradiation intensity ($I_2$) of the applied laser beam on a plane corresponding to 95% of the total irradiation energy of the applied laser beam.

<Image Erasing Step>

Next, the image was erased by heating the image at 140° C. for 1 sec under a pressure of 1 kgf/cm$^2$, using a thermal inclination tester (TYPE HG-100, produced by Toyo Seiki Co., Ltd.). When image recording and image erasure were repeated under the above-mentioned conditions, and the density of the erased portion was measured once every 5 times, it turned out that image erasure was possible with a density of 0.17 at the time when repeated 30 times, and that an unerased portion was left with a density of 0.20 at the time when repeated 35 times.

Subsequently, when an image was recorded under the above-mentioned recording conditions except that the laser output was reduced, the minimum width of the line free from blurring was 0.24 mm. The results are shown in Table 1.

Comparative Example 9

The following image forming step and image erasing step were carried out on the thermoreversible recording medium of Production Example 1.

<Image Forming Step>

A 140 W fiber-coupled high-output semiconductor laser device equipped with a light collecting optical system f100 (NBT-S140mkII, center wavelength: 808 nm, core diameter of an optical fiber: 600 μm, NA: 0.22, produced by Jenoptik) was used as a laser, the laser output, the irradiation distance and the spot diameter were adjusted to 12 W, 91.4 mm and approximately 0.6 mm, respectively. A linear image was formed on the thermoreversible recording medium by applying a laser beam at a feed speed of XY stage of 1,200 mm/s.

On this occasion, the irradiation intensity ($I_1$) of the applied laser beam in a central position of the applied laser beam was 1.19 times the irradiation intensity ($I_2$) of the applied laser beam on a plane corresponding to 95% of the total irradiation energy of the applied laser beam.

<Image Erasing Step>

Next, the image was erased by heating the image at 140° C. for 1 sec under a pressure of 1 kgf/cm$^2$, using a thermal inclination tester (TYPE HG-100, produced by Toyo Seiki Co., Ltd.). When image recording and image erasure were repeated under the above-mentioned conditions, and the density of the erased portion was measured once every 10 times, it turned out that image erasure was possible with a density of 0.17 at the time when repeated 100 times, and that an unerased portion was left with a density of 0.20 at the time when repeated 110 times.

Subsequently, when an image was recorded under the above-mentioned recording conditions except that the laser output was reduced, the minimum width of the line free from blurring was 0.37 mm. The results are shown in Table 1.

Comparative Example 10

The following image forming step and image erasing step were carried out on the thermoreversible recording medium of Production Example 1.

<Image Forming Step>

A 140 W fiber-coupled high-output semiconductor laser device equipped with a light collecting optical system f100 (NBT-S140mkII, center wavelength: 808 nm, core diameter of an optical fiber: 600 μm, NA: 0.22, produced by Jenoptik) was used as a laser, the laser output, the irradiation distance and the spot diameter were adjusted to 12 W, 92.5 mm and approximately 0.6 mm, respectively. A linear image was formed on the thermoreversible recording medium by applying a laser beam at a feed speed of XY stage of 1,200 mm/s.

On this occasion, the irradiation intensity ($I_1$) of the applied laser beam in a central position of the applied laser beam was 1.43 times the irradiation intensity ($I_2$) of the applied laser beam on a plane corresponding to 95% of the total irradiation energy of the applied laser beam.

<Image Erasing Step>

Next, the image was erased by heating the image at 140° C. for 1 sec under a pressure of 1 kgf/cm$^2$, using a thermal inclination tester (TYPE HG-100, produced by Toyo Seiki Co., Ltd.).

When image recording and image erasure were repeated under the above-mentioned conditions, and the density of the erased portion was measured once every 2 times, it turned out that image erasure was possible with a density of 0.17 at the time when repeated 10 times, and that an unerased portion was left with a density of 0.20 at the time when repeated 110 times.

Subsequently, when an image was recorded under the above-mentioned recording conditions except that the laser output was reduced, the minimum width of the line free from blurring was 0.18 mm. The results are shown in Table 1.

TABLE 1

| | $I_1/I_2$ | Durability against repeated use | Printed line width | Line width free from blurring upon reduction of the laser output |
|---|---|---|---|---|
| Example 1 | 1.29 | 250 times | 0.33 mm | 0.20 mm |
| Example 2 | 1.25 | 400 times | 0.33 mm | 0.21 mm |
| Example 3 | 1.20 | 600 times | 0.33 mm | 0.25 mm |
| Example 4 | 1.29 | 400 times | 0.33 mm | 0.21 mm |
| Example 5 | 1.25 | 600 times | 0.33 mm | 0.22 mm |
| Example 6 | 1.20 | 800 times | 0.33 mm | 0.25 mm |
| Example 7 | 1.25 | 700 times | 0.45 mm | 0.29 mm |
| Example 8 | 1.24 | 700 times | 0.44 mm | 0.29 mm |
| Comparative Example 1 | 1.43 | 40 times | 0.33 mm | 0.17 mm |
| Comparative Example 2 | 1.30 | 100 times | 0.33 mm | 0.19 mm |
| Comparative Example 3 | 1.19 | 800 times | 0.33 mm | 0.30 mm |
| Comparative Example 4 | 1.43 | 60 times | 0.33 mm | 0.18 mm |
| Comparative Example 5 | 1.30 | 150 times | 0.33 mm | 0.19 mm |
| Comparative Example 6 | 1.19 | 1,300 times | 0.33 mm | 0.31 mm |
| Example 10 | 1.25 | 90 times | 0.40 mm | 0.25 mm |
| Comparative Example 8 | 1.30 | 30 times | 0.40 mm | 0.24 mm |
| Comparative Example 9 | 1.19 | 100 times | 0.40 mm | 0.37 mm |

TABLE 1-continued

| | $I_1/I_2$ | Durability against repeated use | Printed line width | Line width free from blurring upon reduction of the laser output |
|---|---|---|---|---|
| Comparative Example 10 | 1.43 | 10 times | 0.40 mm | 0.17 mm |

$I_1$: irradiation intensity of an applied laser beam in a central position of the applied laser beam
$I_2$: irradiation intensity of an applied laser beam on a plane corresponding to 95% of the total irradiation energy of the applied laser beam The image processing method and the image processing apparatus of the present invention are capable of repeatedly recording and erasing a high-contrast image at high speed and in a noncontact manner onto and from a thermoreversible recording medium, for example a label affixed to cardboard or to a receptacle such as a plastic container, and also capable of reducing degradation of the thermoreversible recording medium caused by repeated use, and thus being particularly suitably used in product distribution and delivery systems.

What is claimed is:

1. An image processing method comprising:

at least one of recording an image onto a thermoreversible recording medium in which transparency or color tone reversibly changes depending upon temperature, by applying a laser beam with the use of a semiconductor laser device so as to heat the thermoreversible recording medium, and erasing an image recorded on the thermoreversible recording medium, by heating the thermoreversible recording medium, wherein an intensity distribution of the laser beam applied in the image recording step satisfies the relationship represented by Expression 1 shown below, $$1.20 \leqq I_1/I_2 \leqq 1.29 \quad \text{Expression 1}$$

where $I_1$ denotes an irradiation intensity of the applied laser beam in a central position of the applied laser beam, and $I_2$ denotes an irradiation intensity of the applied laser beam on a plane corresponding to 95% of the total irradiation energy of the applied laser beam.

2. The image processing method according to claim 1, wherein the step of erasing an image is carried out by applying a laser beam so as to heat the thermoreversible recording medium.

3. The image processing method according to claim 1, wherein the thermoreversible recording medium comprises at least a support, and a thermoreversible recording layer over the support; and the transparency or color tone of the thermoreversible recording layer reversibly changes at a first specific temperature and at a second specific temperature higher than the first specific temperature.

4. The image processing method according to claim 3, wherein the thermoreversible recording layer contains a resin and a low-molecular organic material.

5. The image processing method according to claim 3, wherein the thermoreversible recording layer contains a leuco dye and a reversible developer.

6. The image processing method according to claim 1, wherein the thermoreversible recording medium contains a photothermal conversion material.

7. The image processing method according to claim 6, wherein a thermoreversible recording layer contains the photothermal conversion material.

8. The image processing method according to claim 6, wherein the photothermal conversion material is a phthalocyanine compound.

9. The image processing method according to claim 1, being used for at least one of recording an image onto a moving object and erasing an image from the moving object.

10. The image processing method according to claim 1, wherein said plane corresponds to a horizontal dividing plane that divides a three-dimensional representation of the irradiation intensity of the irradiated laser beam, such that 95% of the total irradiation energy of the irradiated laser beam is present between said horizontal dividing plane and a plane corresponding to a surface of the thermoreversible recording medium.

* * * * *